United States Patent
Yang et al.

(10) Patent No.: US 11,656,646 B2
(45) Date of Patent: May 23, 2023

(54) MANAGING REFERENCE VOLTAGES IN MEMORY SYSTEMS

(71) Applicant: Macronix International Co., Ltd., Hsinchu (TW)

(72) Inventors: Shang-Chi Yang, Changhua (TW); Jian-Syu Lin, Chiayi (TW)

(73) Assignee: Macronix International Co., Ltd., Hsinchu (TW)

( * ) Notice: Subject to any disclaimer, the term of this patent is extended or adjusted under 35 U.S.C. 154(b) by 156 days.

(21) Appl. No.: 17/135,131

(22) Filed: Dec. 28, 2020

(65) Prior Publication Data
US 2022/0019254 A1     Jan. 20, 2022

Related U.S. Application Data

(60) Provisional application No. 63/054,234, filed on Jul. 20, 2020.

(51) Int. Cl.
*G05F 3/26* (2006.01)
*G11C 5/14* (2006.01)

(52) U.S. Cl.
CPC .............. *G05F 3/262* (2013.01); *G11C 5/147* (2013.01)

(58) Field of Classification Search
None
See application file for complete search history.

(56) References Cited

U.S. PATENT DOCUMENTS

| | | | | |
|---|---|---|---|---|
| 5,087,830 A | * | 2/1992 | Cave | G05F 3/30 327/539 |
| 5,381,083 A | * | 1/1995 | Inamori | G05F 3/265 327/538 |
| 6,023,189 A | * | 2/2000 | Seelbach | G05F 3/30 327/543 |
| 6,225,796 B1 | * | 5/2001 | Nguyen | G05F 3/30 323/313 |

(Continued)

FOREIGN PATENT DOCUMENTS

CN         101382812 A      11/2009

OTHER PUBLICATIONS

The State Intellectual Property Office of People's Republic of China First Office Action dated Oct. 18, 2022, including English Translation, 29 pages.

*Primary Examiner* — Thomas J. Hiltunen
(74) *Attorney, Agent, or Firm* — Fish & Richardson P.C.

(57) ABSTRACT

Systems, methods, circuits, devices, and apparatus including computer-readable mediums for managing reference voltages, e.g., with current compensation, in memory systems, e.g., non-volatile memory systems. In one aspect, an integrated circuit includes: an operational amplifier configured to receive input voltages and a supply voltage and output a control voltage based on the input voltages and the supply voltage; an output circuitry configured to receive the control voltage from the operational amplifier and the supply voltage, provide the input voltages to the operational amplifier, and output a reference voltage; and a compensation circuitry coupled to the output circuitry and configured to output a compensation current to compensate the output circuitry such that the reference voltage is substantially constant. The output circuitry is configured to generate the reference voltage based on the control voltage and the compensation current.

20 Claims, 14 Drawing Sheets

(56) References Cited

U.S. PATENT DOCUMENTS

| | | | | |
|---|---|---|---|---|
| 6,384,586 B1* | 5/2002 | Sugawara | ............... | G05F 3/225 |
| | | | | 323/316 |
| 6,492,795 B2* | 12/2002 | Engl | ...................... | G05F 3/262 |
| | | | | 323/907 |
| 6,492,850 B2* | 12/2002 | Kato | ...................... | G05F 1/465 |
| | | | | 327/143 |
| 7,113,025 B2* | 9/2006 | Washburn | ................ | G05F 3/30 |
| | | | | 327/539 |
| 7,253,598 B1* | 8/2007 | Doyle | ....................... | G05F 3/30 |
| | | | | 327/539 |
| 7,978,004 B2* | 7/2011 | Houston | ............ | H03K 19/0016 |
| | | | | 327/537 |
| 8,120,415 B2* | 2/2012 | Conte | ...................... | G05F 3/30 |
| | | | | 327/539 |
| 8,941,369 B2* | 1/2015 | Youssefi | .................. | G05F 3/30 |
| | | | | 323/316 |
| 9,582,021 B1* | 2/2017 | Arnold | ...................... | G05F 3/16 |
| 10,061,340 B1* | 8/2018 | Rao | ......................... | G05F 3/267 |
| 10,642,305 B2* | 5/2020 | Lee | .......................... | G05F 3/30 |
| 11,127,437 B2* | 9/2021 | Lin | ......................... | H03F 1/301 |
| 2001/0010480 A1* | 8/2001 | Kato | ...................... | G05F 1/465 |
| | | | | 327/546 |
| 2002/0093325 A1* | 7/2002 | Ju | ............................ | G05F 3/30 |
| | | | | 323/314 |
| 2009/0001958 A1* | 1/2009 | Fujii | ....................... | G05F 3/30 |
| | | | | 323/313 |
| 2009/0058512 A1 | 3/2009 | Huang | | |
| 2010/0073069 A1* | 3/2010 | Wang | .................. | H03K 17/145 |
| | | | | 327/513 |
| 2010/0164608 A1* | 7/2010 | Shin | ......................... | G05F 3/30 |
| | | | | 327/539 |

* cited by examiner

MANAGING REFERENCE VOLTAGES IN MEMORY SYSTEMS

CROSS-REFERENCE TO RELATED APPLICATION

This application claims priority under 35 USC § 119(e) to U.S. Provisional Patent Application Ser. No. 63/054,234, filed on Jul. 20, 2020, the entire content of which is hereby incorporated by reference.

BACKGROUND

Integrated circuit memory systems are becoming smaller and faster. Reference voltage circuits are often used in these memory systems to provide reference voltages. For example, a bandgap reference circuit can provide a bandgap reference voltage to a non-volatile memory system for performing an operation of programming, erasing, verifying, or reading in a non-volatile memory. Therefore, it would be desirable to develop a bandgap reference circuit that can obtain a stable bandgap reference voltage with a desired voltage level to thereby improve the performance of the non-volatile memory system.

SUMMARY

The present disclosure describes systems and techniques for managing reference voltages, e.g., bandgap reference voltages, in memory systems, e.g., non-volatile memory systems, particularly with current compensation.

One aspect of the present disclosure features an integrated circuit including: an operational amplifier (OPA) configured to receive input voltages and a supply voltage and output a gate control voltage based on the input voltages and the supply voltage; an output circuitry configured to receive the gate control voltage from the operational amplifier and the supply voltage, provide the input voltages to the operational amplifier, and output a reference voltage; and a compensation circuitry coupled to the output circuitry and configured to output a compensation current to compensate the output circuitry such that the reference voltage is substantially constant. The output circuitry is configured to generate the reference voltage based on the gate control voltage and the compensation current.

In some implementations, the compensation circuitry is configured to receive the gate control voltage and the supply voltage, generate the compensation current based on the gate control voltage and the supply voltage, and provide the compensation current to the output circuitry.

In some implementations, the output circuitry includes: a plurality of p-channel transistors having gates configured to receive the gate control voltage and sources configured to receive the supply voltage; and a plurality of bipolar junction transistors (BJTs) having emitters respectively coupled to drains of the p-channel transistors, and bases and collectors coupled to a ground. The reference voltage is output at an output node coupled to a drain of a first p-channel transistor of the p-channel transistors and an emitter of a first BJT of the BJTs.

In some implementations, the compensation circuitry includes a compensation p-channel transistor corresponding to the first p-channel transistor. The compensation p-channel transistor includes: a source configured to receive the supply voltage, a gate coupled to a gate of the first p-channel transistor and configured to receive the gate control voltage, and a drain coupled to the emitter of the first BJT and configured to output the compensation current to the first BJT.

In some implementations, the output circuitry includes a first resistor having a first end coupled to the drain of the first p-channel transistor and a second end coupled to the emitter of the first BJT. The output node is coupled between the drain of the first p-channel transistor and the first end of the first resistor, and the compensation circuitry is coupled to a connection point between the second end of the first resistor and the emitter of the first BJT and configured to provide the compensation current to the first BJT.

In some implementations, the output circuitry includes: a second resistor having a first end coupled to the output node and a second end coupled to the ground, and the reference voltage is associated with a ratio between the first resistor and the second resistor.

In some implementations, the output circuitry includes a third resistor coupled between a second p-channel transistor of the p-channel transistors and a second BJT of the BJTs. A gate of a third p-channel transistor of the p-channel transistors is coupled to a gate of the second p-channel transistor, and a drain of the third p-channel transistor is coupled to an emitter of a third BJT of the BJTs. The integrated circuit is configured such that the reference voltage can be expressed as:

$$V_x = \frac{R_2}{R_1 + R_2}\left(V_{BE} + \frac{R_1}{R_3}\Delta V_{BE}\right),$$

where $V_x$ represents the reference voltage, $R_1$ represents a resistance of the first resistor, $R_2$ represents a resistance of the second resistor, $R_3$ represents a resistance of the third resistor, $V_{BE}$ represents an emitter-base voltage of the first BJT, and $\Delta V_{BE}$ represents a voltage difference between emitter-base voltages of the second BJT and the third BJT.

In some implementations, the integrated circuit is configured such that a sum of $V_{BE}$ and $R_1/R_3 \Delta V_{BE}$ is substantially constant.

In some implementations, the output circuitry is configured to provide a first input voltage of the input voltages at a first connection point between a drain of the second p-channel transistor and an emitter of the second BJT, and a second input voltage of the input voltages at a second connection point between the drain of the third p-channel transistor to the emitter of the third BJT.

In some implementations, the integrated circuit is configured such that an emitter-base voltage of the first BJT is linearly inverse to a change of a temperature.

In some implementations, the integrated circuit is configured such that the reference voltage is higher than a turn-on voltage of the first BJT, and the integrated circuit is configured such that a current from the first p-channel transistor flows through the first resistor into the first BJT and through the second resistor into the ground.

In some implementations, the integrated circuit is configured such that the reference voltage is lower than the turn-on voltage of the first BJT, and the integrated circuit is configured such that a current from the first p-channel transistor flows towards the output node into the second resistor.

In some implementations, the compensation circuitry is configured such that the compensation current is proportional to a current flowing from the first p-channel transistor.

In some implementations, the operational amplifier includes first and second OPA p-channel transistors and first and second OPA n-channel transistors. Sources of the first and second OPA p-channel transistors can be configured to receive the supply voltage, gates of the first and second OPA p-channel transistors are coupled together to receive a second gate control voltage, and drains of the first and second OPA p-channel transistors are respectively coupled to drains of the first and second OPA n-channel transistors. Gates of the first and second OPA n-channel transistors can be respectively configured to receive the input voltages from the output circuitry. The operational amplifier can be configured to output the gate control voltage at a first OPA connection point between a drain of the first OPA p-channel transistor and a drain of the first OPA n-channel transistor.

In some implementations, the compensation circuitry is coupled to the operational amplifier and configured to receive the second gate control voltage, generate the compensation current based on the second gate control voltage, and provide the compensation current to the output circuitry.

In some implementations, the integrated circuit further includes: a first startup circuit coupled to the first OPA connection point and configured to receive a startup signal to startup the integrated circuit; and a second startup circuit coupled to a second OPA connection point between a drain of the second OPA p-channel transistor and a drain of the second OPA n-channel transistor and configured to provide the second gate control voltage to the first OPA p-channel transistor and the second OPA p-channel transistor, the second startup circuit corresponding to the first startup circuit.

In some implementations, the first startup circuit includes a first startup transistor having a source coupled to the ground, a gate configured to receive the startup signal, and a drain coupled to the first OPA connection point, and the second startup circuit includes a second startup transistor having a source coupled to the ground, a gate configured to receive a voltage signal, and a drain coupled to the second OPA connection point, the second startup transistor corresponding to the first startup transistor.

In some implementations, the compensation circuitry includes a compensation p-channel transistor corresponding to the first OPA p-channel transistor and the second OPA p-channel transistor. The compensation p-channel transistor can include: a source configured to receive the supply voltage, a gate coupled to a gate of the first OPA p-channel transistor and configured to receive the second gate control voltage, and a drain coupled to an emitter of a corresponding BJT in the output circuitry and configured to output the compensation current to the corresponding BJT.

In some implementations, the integrated circuit further includes a power supply switch configured to receive an original supply voltage and provide a controlled supply voltage controllable by an enabling signal as the supply voltage to the operational amplifier, the output circuitry, and the compensation circuitry. The power supply switch can include a power transistor having a gate for receiving the enabling signal and being configured to generate the controlled supply voltage based on the original supply voltage in response to the enabling signal.

In some implementations, the integrated circuit further includes a coupling capacitor having a first end for receiving the supply voltage and a second end coupled to an output of the operational amplifier for outputting the gate control voltage.

In some implementations, the integrated circuit is configured to stabilize the reference voltage to be independent from temperature, process corner, voltage, or a combination thereof.

In some implementations, the compensation circuitry is coupled to a second circuit external to the integrated circuit and configured to generate a compensation current corresponding to a current in the second circuit, and the compensation circuitry is configured to provide the compensation current to the output circuitry.

Another aspect of the present disclosure features a memory system including: a memory, a memory controller coupled to the memory, and a bandgap reference circuit coupled to the memory controller and configured to provide a bandgap reference voltage to the memory controller for performing one or more actions on the memory. The bandgap reference circuit includes: an operational amplifier configured to receive input voltages and a supply voltage and output a gate control voltage based on the input voltages and the supply voltage; an output circuitry configured to receive the gate control voltage from the operational amplifier and the supply voltage, provide the input voltages to the operational amplifier, and output the bandgap reference voltage; and a compensation circuitry coupled to the output circuitry and configured to output a compensation current to compensate the output circuitry such that the bandgap reference voltage is substantially constant. The output circuitry is configured to generate the bandgap reference voltage based on the gate control voltage and the compensation current.

A further aspect of the present disclosure features a method including: receiving, by an operational amplifier, input voltages from an output circuitry and a supply voltage; outputting, by the operational amplifier and based on the input voltages and the supply voltage, a first control voltage to the output circuitry; compensating, by a compensation circuitry, the output circuitry by outputting a compensation current to the output circuitry, the compensation current being based on one of the first control voltage, a second control voltage received by the operational amplifier, or a third control voltage provided by an external circuit to the compensation circuitry; and outputting, by the output circuitry and based on the first control voltage and the compensation current, a reference voltage that is substantially constant.

Implementations of the above techniques include methods, systems, circuits, computer program products and computer-readable media. In one example, a method can be performed in a non-volatile memory and the method can include the above-described actions. In another example, one such computer program product is suitably embodied in a non-transitory machine-readable medium that stores instructions executable by one or more processors. The instructions are configured to cause the one or more processors to perform the above-described actions. One such computer-readable medium stores instructions that, when executed by one or more processors, are configured to cause the one or more processors to perform the above-described actions.

The techniques can be implemented for any type of circuits or devices that need stable output voltages at desired voltage levels. The techniques can reduce an output voltage variation and obtain a low output voltage level using current compensation technology. For example, in a non-volatile memory system, a bandgap reference circuit can provide a bandgap reference voltage to a memory controller for performing an operation of programming, erasing, verifying, or reading in a non-volatile memory. The bandgap reference circuit can be configured to make the bandgap reference voltage stable and independent from temperatures, process corners, and/or voltages, or PVT (process-voltage-temperature) effect. That is, the bandgap reference voltage can be kept substantially constant under different process corners, different temperatures, and/or different voltages. The bandgap reference voltage can be configured to a smaller voltage, e.g., below a turn-on voltage of a bipolar junction transistor (BJT) in the bandgap reference circuit. In some examples, the bandgap reference voltage is below 1 Volt (V), e.g., 0.8V, 0.7V, 0.6V, 0.5V, or any other desired low voltage. In such a way, the bandgap reference voltage can be used in various applications in memory systems, while reducing power consumption in the memory systems.

The techniques can be implemented with any types of memory transistors, any types of metal-oxide-silicon (MOS) transistors, e.g., n-channel transistors (NMOS) and/or p-channel transistors (PMOS), any types of bipolar junction transistors (BJTs), and any types of operational amplifiers (OPAs) such as folded-cascode OPAs or two-stage OPAs. The techniques can be implemented with any types of capacitors, such as metal-insulator-metal capacitors (MIMCAPs), metal-oxide-silicon capacitors (MOSCAPs), or metal-oxide-semiconductor field-effect transistor capacitors (MOSFET CAPs).

The techniques can be applied to various memory types, such as SLC (single-level cell) devices, or MLC (multi-level cell) devices like 2-level cell devices or TLC (triple-level cell) devices. The techniques can be applied to various types of non-volatile memory devices, such as NOR flash memory, NAND flash memory, resistive random-access memory (RRAM), phase-change random-access memory (PCRAM), among others. Additionally or alternatively, the techniques can be applied to various types of devices and systems, such as secure digital (SD) cards, embedded multimedia cards (eMMC), or solid-state drives (SSDs), embedded systems, among others.

The details of one or more disclosed implementations are set forth in the accompanying drawings and the description below. Other features, aspects, and advantages will become apparent from the description, the drawings and the claims.

DETAILED DESCRIPTION

Figure 1:
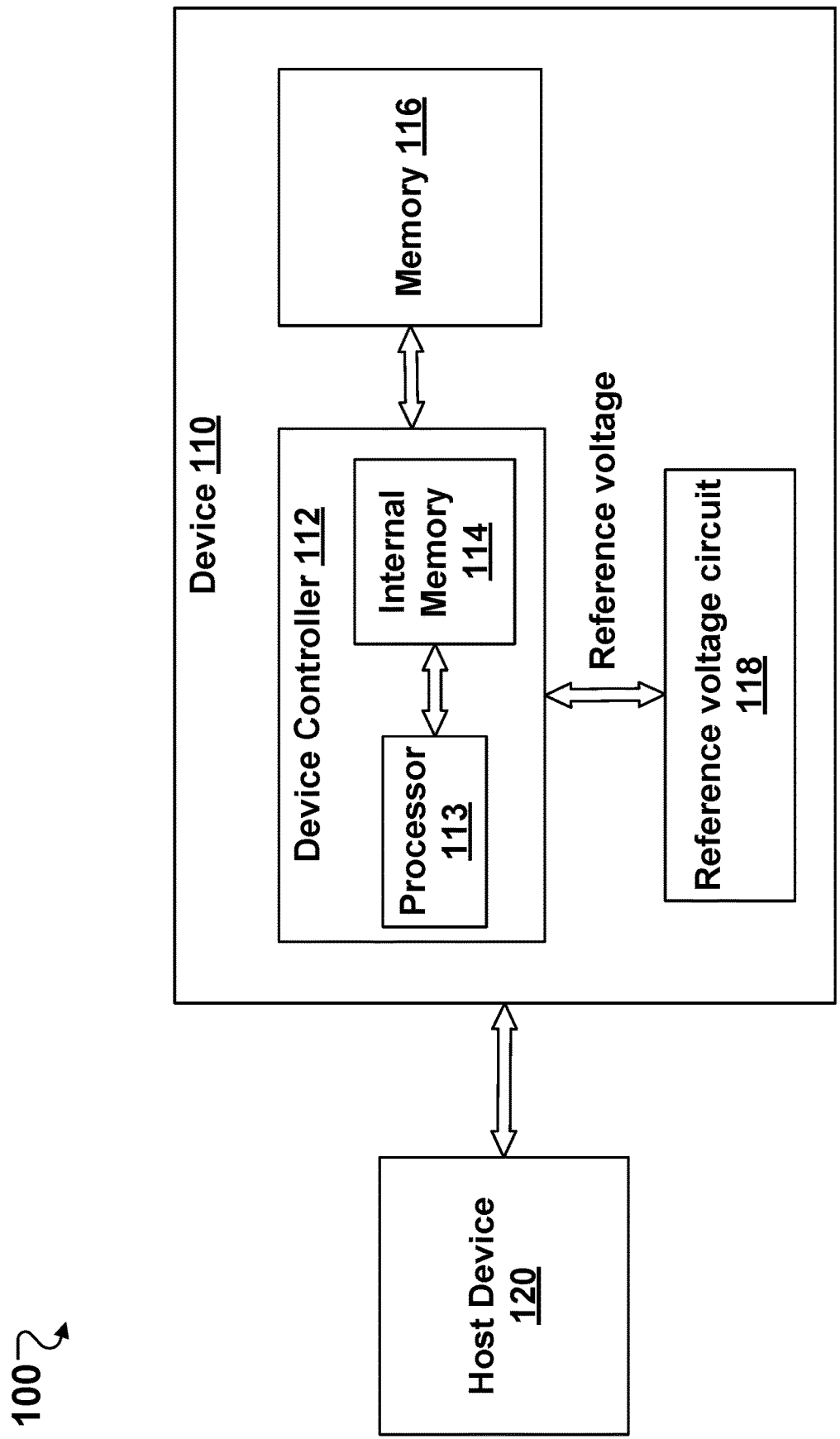
FIG. 1 illustrates an example of a system including a memory system, according to one or more implementations of the present disclosure.

To reduce a level of a bandgap reference voltage, a conventional bandgap reference circuit can scale down an output voltage by tying a resistor from an output node to a ground. However, the resistor can sink an incoming current so that a BJT current over a corresponding BJT in the bandgap reference circuit is too low at low temperatures, resulting in non-ideal effects on the corresponding BJT, which can increase a variation of the bandgap reference voltage. In addition, the conventional bandgap circuit can be limited by a density of the BJT current so that the output bandgap reference voltage cannot be designed to be lower than an emitter-base voltage of the corresponding BJT.

Implementations of the present disclosure provide methods, devices, circuits, systems and techniques for managing reference voltages, e.g., bandgap reference voltages, with current compensation in memory systems. By using the current compensation, a bandgap reference voltage circuit can reduce a voltage variation of a bandgap reference voltage and greatly reduce a voltage level of the bandgap reference voltage.

In some implementations, an integrated circuit includes: an operational amplifier (OPA) configured to receive input voltages and output a gate control voltage, an output circuitry configured to receive the gate control voltage from the operational amplifier, provide the input voltages to the operational amplifier, and output a reference voltage, and a compensation circuitry coupled to the output circuitry and configured to compensate the output circuitry such that the compensation circuitry reduces a variation of the reference voltage. The compensation circuitry can generate a compensation current to compensate the compensation circuitry. The compensation current can be generated based on the gate control voltage and the supply voltage. The reference voltage can be generated based on the gate control voltage and the compensation current.

In some implementations, the compensation circuitry includes one or more transistors, e.g., PMOS transistors, that can correspond to (or mirror) one or more transistors in the output circuitry, in the operational amplifier, or in a circuit external to the integrated circuit, such that a compensation current through the one or more transistors in the compensation circuitry can correspond to (or mirror) a current through the one or more transistors in the output circuitry, in the operational amplifier, or in the external circuit.

In some implementations, the compensation current can compensate a BJT current of a BJT in the output circuitry to eliminate non-ideal effects of the BJT at low temperatures to reduce variations of the reference voltage. In some examples, a PMOS transistor can be used in the compensation circuitry to mirror a positive temperature coefficient current by a delta emitter-base voltage from two BJTs with different current densities through a resistance. The positive temperature coefficient current can be used to generate a positive temperature coefficient voltage, which can be combined with a negative temperature coefficient voltage from a voltage of emitter-base from a third BJT to achieve zero temperature coefficient voltage.

The operational amplifier can be any type OPA, such as a folded-cascode OPA or a two-stage OPA. In some implementations, the operational amplifier includes four MOSFETs, including a pair of two PMOS transistors and a pair of two NMOS transistors and is configured to generate a biasing current with diffusion resistance. The operational amplifier can be replaced with a constant bias current or other operation amplifier architecture. Two additional NMOS transistors can be coupled to the operational amplifier and configured for startup and for avoiding mismatch on the pair of NMOS transistors.

FIG. 1 illustrates an example of a system 100. The system 100 includes a device 110 and a host device 120. The device 110 can be a memory system including a device controller 112 and a memory 116. The device controller 112 includes a processor 113 and an internal memory 114.

In some implementations, the device 110 is a storage device. For example, the device 110 can be an embedded multimedia card (eMMC), a secure digital (SD) card, a solid-state drive (SSD), or some other suitable storage. In some implementations, the device 110 is a smart watch, a digital camera or a media player. In some implementations, the device 110 is a client device that is coupled to a host device 120. For example, the device 110 is an SD card in a digital camera or a media player that is the host device 120.

The device controller 112 is a general-purpose microprocessor, or an application-specific microcontroller. In some implementations, the device controller 112 is a memory controller for the device 110. The following sections describe the various techniques based on implementations in which the device controller 112 is a memory controller. However, the techniques described in the following sections are also applicable in implementations in which the device controller 112 is another type of controller that is different from a memory controller.

The processor 113 is configured to execute instructions and process data. The instructions include firmware instructions and/or other program instructions that are stored as firmware code and/or other program code, respectively, in the secondary memory. The data includes program data corresponding to the firmware and/or other programs executed by the processor, among other suitable data. In some implementations, the processor 113 is a general-purpose microprocessor, or an application-specific microcontroller. The processor 113 is also referred to as a central processing unit (CPU).

The processor 113 accesses instructions and data from the internal memory 114. In some implementations, the internal memory 114 is a Static Random Access Memory (SRAM) or a Dynamic Random Access Memory (DRAM). For example, in some implementations, when the device 110 is an eMMC, an SD card or a smart watch, the internal memory 114 is an SRAM. In some implementations, when the device 110 is a digital camera or a media player, the internal memory 114 is DRAM.

In some implementations, the internal memory is a cache memory that is included in the device controller 112, as shown in FIG. 1. The internal memory 114 stores instruction codes, which correspond to the instructions executed by the processor 113, and/or the data that are requested by the processor 113 during runtime.

The device controller 112 transfers the instruction code and/or the data from the memory 116 to the internal memory 114. In some implementations, the memory 116 is a non-volatile memory that is configured for long-term storage of instructions and/or data, e.g., an NAND or NOR flash memory device, or some other suitable non-volatile memory device. In implementations where the memory 116 is an NAND or NOR flash memory, the device 110 is a flash memory device, e.g., a flash memory card, and the device controller 112 is an NAND or NOR flash controller. For example, in some implementations, when the device 110 is an eMMC or an SD card, the memory 116 is an NAND or NOR flash; in some implementations, when the device 110 is a digital camera, the memory 116 is an SD card; and in some implementations, when the device 110 is a media player, the memory 116 is a hard disk.

The device 110 includes a reference voltage circuit 118. The reference voltage circuit 118 is configured to generate a reference voltage provided to the device controller 112. The device controller 112 can receive the reference voltage and perform one or more actions in the memory 116. As discussed with further details below, the reference voltage circuit 118 can be configured such that the reference voltage can be independent from temperature, process corner, voltage, or an overall PVT effect.

The reference voltage circuit 118 can be a bandgap reference circuit configured to generate a bandgap reference (BGREF) voltage. As illustrated in FIG. 1, the bandgap reference circuit can provide the bandgap reference voltage to the device controller 112. The device controller 112 can receive the bandgap reference voltage and use the BGREF voltage to produce a level of a control signal in a word line or a bit line for performing an operation of programming, erasing, verifying, or reading on the memory 116. For example, the device controller 112 can read data in the memory 116 by the bandgap reference voltage for obtaining a reading result. In some examples, the bandgap reference circuit can provide the bandgap reference voltage to a bit line clamping circuit that can be included in the device controller 112. The bit line clamping circuit is configured to generate a stable bit line clamping voltage based on the bandgap reference voltage. The bit line clamping voltage can be independent from PVT effect. The bit line clamping voltage can be provided to a bit line of a memory cell in the memory 116 for reading data from the memory cell. Therefore, it is desirable for the bandgap reference circuit configured to generate the bandgap reference voltage at a stable level with little or no variations.

In some examples, the bandgap reference voltage is used to generate one or more operational voltages for one or more other components, circuits, and/or devices in the device 110. For example, the operational voltages can be multiple times (e.g., 2 times, 5 times, 10 times, or more) higher than the bandgap reference voltage. If the bandgap reference voltage is too high, the operational voltages can exceed damage threshold voltages of the one or more other components, circuits, and/or devices, which can cause overshoots or damages. For example, the bandgap reference voltage reaches a bandgap target voltage of 1 V after a startup completes. A device has an operational voltage that is 10 times of the bandgap reference voltage and a damage threshold voltage of about 15 V. If the bandgap reference voltage varies from 3 V to 1 V during the startup, the operational voltage of the device accordingly varies from 30 V to 10 V during the startup. Thus, the operational voltage can exceed the damage threshold voltage of the device during the startup and cause overshoot or damage on the device. In some implementations, the bandgap reference voltage is used to perform an operation of programming, erasing, verifying, or reading on the memory 116. Therefore, it is desirable for the bandgap reference circuit configured to generate the bandgap reference voltage below a reasonable level that will not cause overshoots and/or can satisfy various scenarios or applications. In some examples, a bandgap reference voltage is below a predetermined voltage, e.g., 1 V, 0.9V, 0.8 V, 0.7V, 0.6 V, 0.5 V, 0.4V, 0.3V, 0.2V, or 0.1V.

Figure 2:
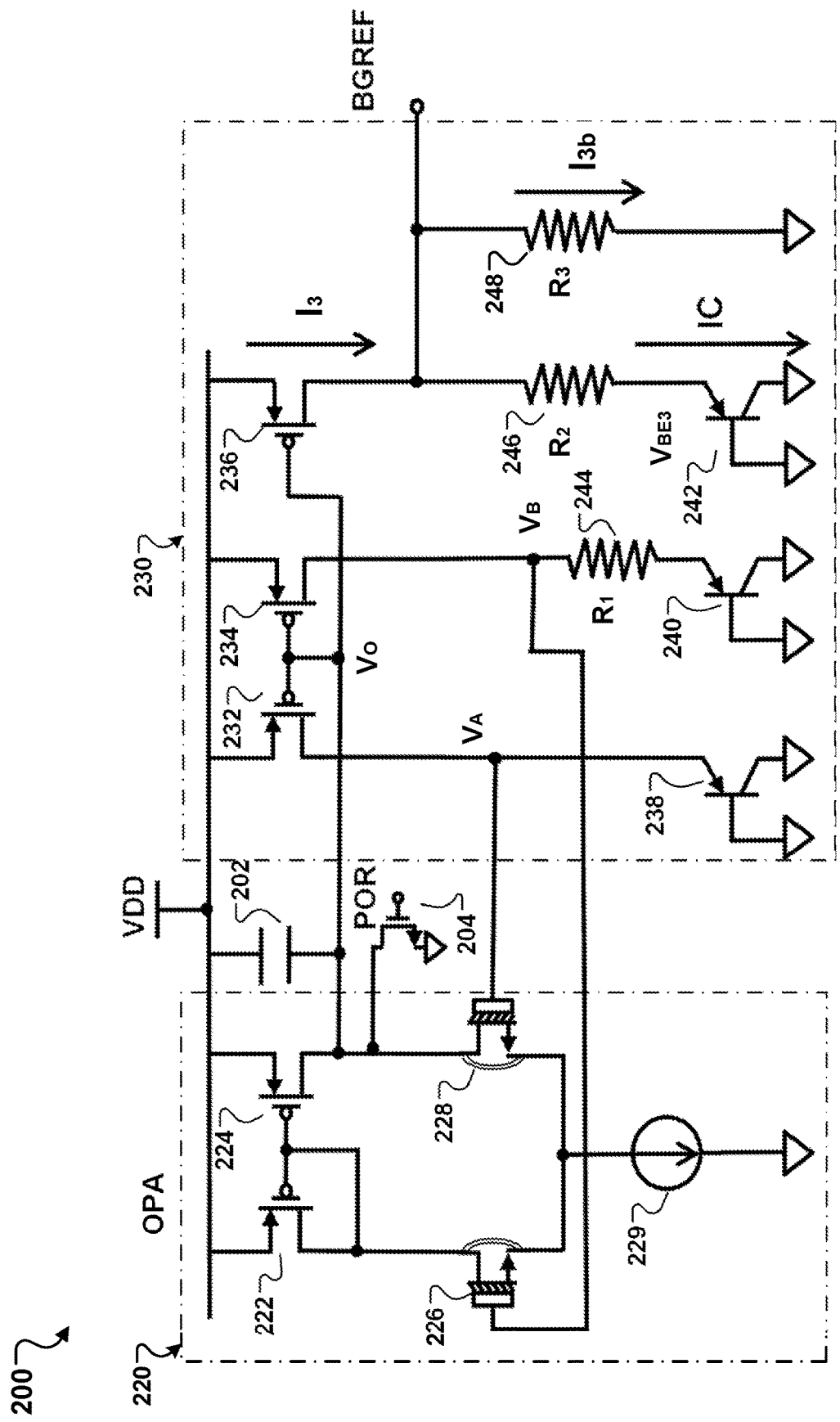
FIG. 2 illustrates a circuit diagram of an example of a conventional bandgap reference circuit.

FIG. 2 shows an example circuit diagram illustrating a conventional bandgap reference circuit 200 configured to provide a bandgap reference (BGREF) voltage. The bandgap reference circuit 200 can be used as the reference voltage circuit 118 of FIG. 1, but the bandgap reference voltage experiences a voltage variation at low temperatures and cannot be below an emitter-base voltage ($V_{BE}$) of a bipolar junction transistor (BJT) in the bandgap reference circuit 200.

As shown in FIG. 2, the bandgap reference circuit 200 includes an operational amplifier (OPA) 220 and output circuitry 230. The bandgap reference circuit 200 also includes a startup circuit that can include a transistor 204, e.g., an NMOS transistor. The transistor 204 is configured to receive a power-on rest (POR) signal as a startup signal to the bandgap reference circuit 200. The transistor 204 includes a gate for receiving the POR signal, a source coupled to a ground, and a drain coupled to the OPA 220 and the output circuitry 230. The bandgap reference circuit 200 receives a supply voltage VDD. The bandgap reference circuit 200 also includes a capacitor 202 that has one end coupled to the supply voltage VDD and the other end coupled to the drain of the transistor 204 of the startup signal circuit.

The OPA 220 includes two p-channel transistors 222 and 224, e.g., PMOS transistors, two n-channel transistors 226 and 228, e.g., NMOS transistors, and a current transistor 229. The p-channel transistors 222 and 224 have their gates coupled together to the drain of the transistor 226 and their sources coupled together to receive the supply voltage VDD. A drain of the p-channel transistor 224 is coupled to the drain of the transistor 204 and to a drain of the n-channel transistor 228. A drain of the p-channel transistor 222 is coupled to a drain of the n-channel transistor 226. Sources of the two n-channel transistors 226 and 228 are coupled together to the current transistor 229 configured for biasing current and coupled to the ground. Gates of the two n-channel transistors 226 and 228 are two inputs of the OPA 220 and configured to receive respective input voltages VA and VB from the output circuitry 230.

The output circuitry 230 includes three p-channel transistors 232, 234, 236, e.g., PMOS transistors, and three bipolar junction transistors (BJTs) 238, 240, 242, e.g., PNP BJTs. Sources of the p-channel transistors 232, 234, 236 are connected together to receive the supply voltage VDD. Gates of the p-channel transistors 232, 234, 236 are connected together to the drain of the transistor 204, the other end of the capacitor 202, and the drain of the transistor 224 in the OPA 220. Thus, a gate control voltage Vo at the gates of the p-channel transistors 232, 234, 236 are associated with the supply voltage VDD, the OPA 220, and the startup circuit (e.g., the transistor 204). The gate control voltage Vo is an output of the OPA 220.

A drain of the p-channel transistor 232 provides an input voltage $V_A$ to the gate of the n-channel transistor 228 of the OPA 220, and a drain of the p-channel transistor 234 is configured to provide an input voltage $V_B$ to the gate of the n-channel transistor 226 of the OPA 220. An emitter of the BJT 238 is connected to the drain of the p-channel transistor 232, and a base and a collector of the BJT 238 are both coupled to the ground. An emitter of the BJT 240 is connected to the drain of the p-channel transistor 234 through a resistor 244 having a resistance of $R_1$, and a base and a collector of the BJT 240 are both coupled to the ground. An emitter of the BJT 242 is connected to the drain of the p-channel transistor 236 through a resistor 246 having a resistance of $R_2$, and a base and a collector of the BJT 242 are both coupled to the ground.

The bandgap reference circuit 200 outputs the bandgap reference (BGREF) voltage at an output node coupled to a connection point between the drain of the p-channel transistor 236 and the resistor 246. The bandgap reference circuit 200 includes a resistor 248 having a resistance of $R_3$. The resistor 248 has one end coupled to a point between the output node and the connection point and the other end coupled to the ground. A current $I_3$ from the p-channel transistor 236 is split into a BJT current $I_C$ through the resistor ($R_2$) 246 and the BJT 242 and a current $I_{3b}$ through the resistor 248 to the ground. The bandgap reference voltage BGREF can be scaled down by changing the resistance $R_3$ of the resistor 248 and/or a ratio of $R_2/R_3$.

When an emitter-base voltage of a BJT is larger than a turn-on voltage of the BJT, a BJT current increases rapidly. When the emitter-base voltage is lower than the turn-on voltage, the BJT current is substantially identical to zero. In some examples, the turn-on voltage of the BJT is about 0.7 V.

In operation of the bandgap reference circuit 200, $I_3=I_{3b}+I_C$, and the resistor 248 can sink the current $I_3$ so that the BJT current $I_C$ is too low at low temperatures, resulting in non-ideal effects that increase a variation of the bandgap reference voltage BGREF. In addition, BGREF=$I_C*R_2+V_{BE3}$, where $V_{BE3}$ is an emitter-base voltage of the BJT 242. Thus, the bandgap reference voltage BGREF output by the bandgap reference circuit 200 is limited by a density of the BJT current $I_C$, and cannot be designed to be lower than the emitter-base voltage $V_{BE3}$ of the BJT 242. In some examples, BGREF cannot be lower than the turn-on voltage of the BJT 242. IF the bandgap reference voltage BGREF is lower than the turn-on voltage of the BJT 242, the BJT 242 will have no current, causing the bandgap reference circuit 200 to not work properly.

Figure 3A:
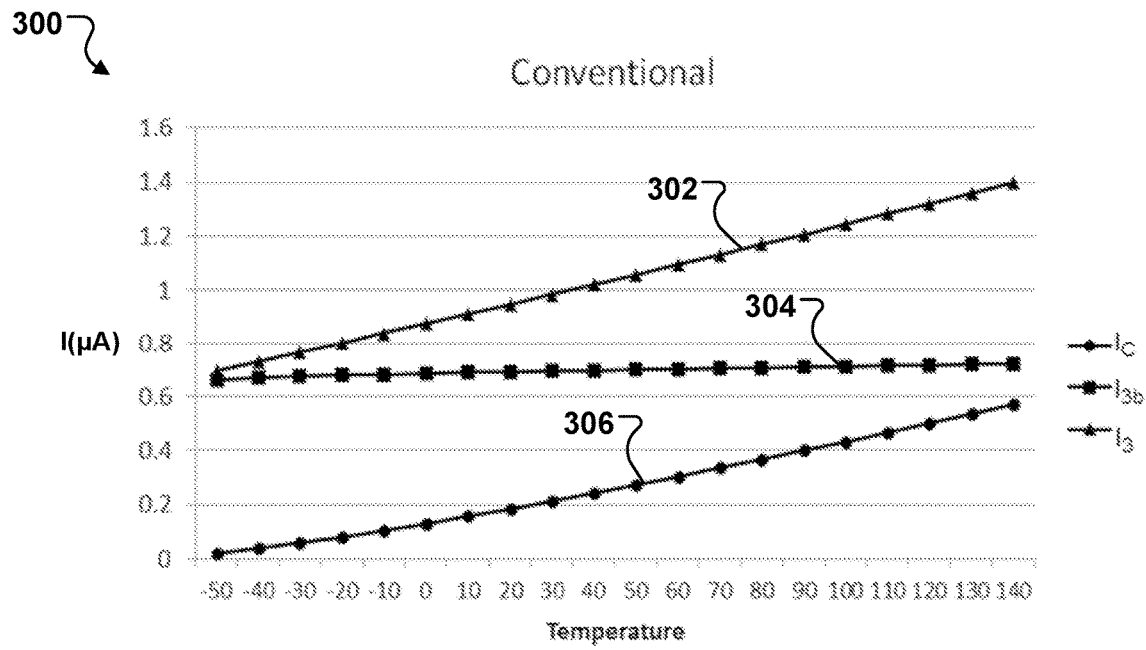
FIG. 3A shows changes of different currents in the bandgap reference circuit of FIG. 2 over a range of temperatures when a bandgap reference voltage is higher than a turn-on voltage of a bipolar junction transistor (BJT).

FIG. 3A is a diagram 300 showing changes of different currents ($I_3$, $I_{3b}$, $I_C$) in the bandgap reference circuit 200 of FIG. 2 over a range of temperatures, e.g., from −50° C. to 135° C., when the bandgap reference voltage BGREF is higher than the turn-on voltage of the BJT 242. For example, the turn-on voltage of the BJT 242 is 0.7 V, and BGREF is designed to be 0.8 V with a ratio of $R_2/R_3$ identical to ½. Plots 302, 304, 306 show the changes of $I_3$, $I_{3b}$, and $I_C$, respectively. Plot 306 shows that the BJT current $I_C$ is too low at low temperatures, e.g., close to zero when the temperature is −50° C., which produces non-ideal effects on the BJT 242. As shown in a diagram 310 of FIG. 3B, the linear curve 314 represents an ideal condition where an emitter-base voltage $V_{BE}$ decreases linearly with an increase of the temperature. Under low temperatures, e.g., lower than −30° C., a plot 312 of the emitter-base voltage $V_{BE3}$ obviates from the linear curve 314 and becomes non-linear, which can result in an increased variation of the bandgap reference voltage BGREF.

Figure 3B:
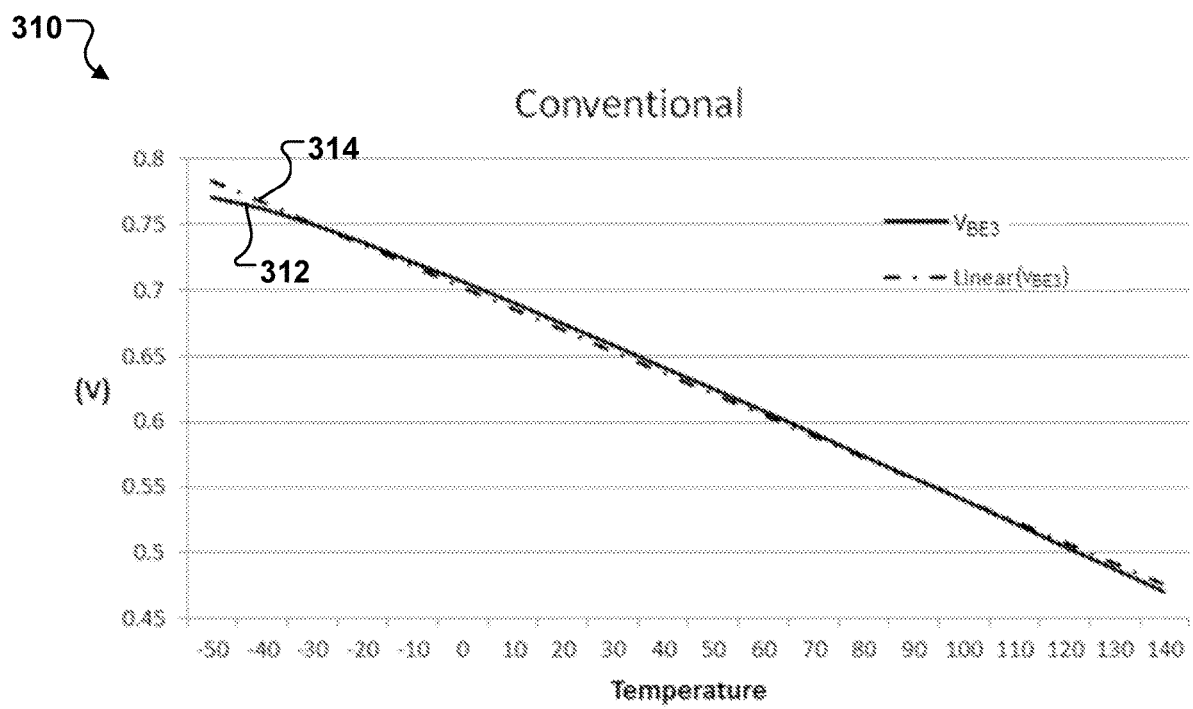
FIG. 3B shows changes of an emitter-base voltage of the bipolar junction transistor (BJT) in the bandgap reference circuit of FIG. 2 over a range of temperatures when the bandgap reference voltage is higher than the turn-on voltage of the bipolar junction transistor (BJT).
Figure 3C:
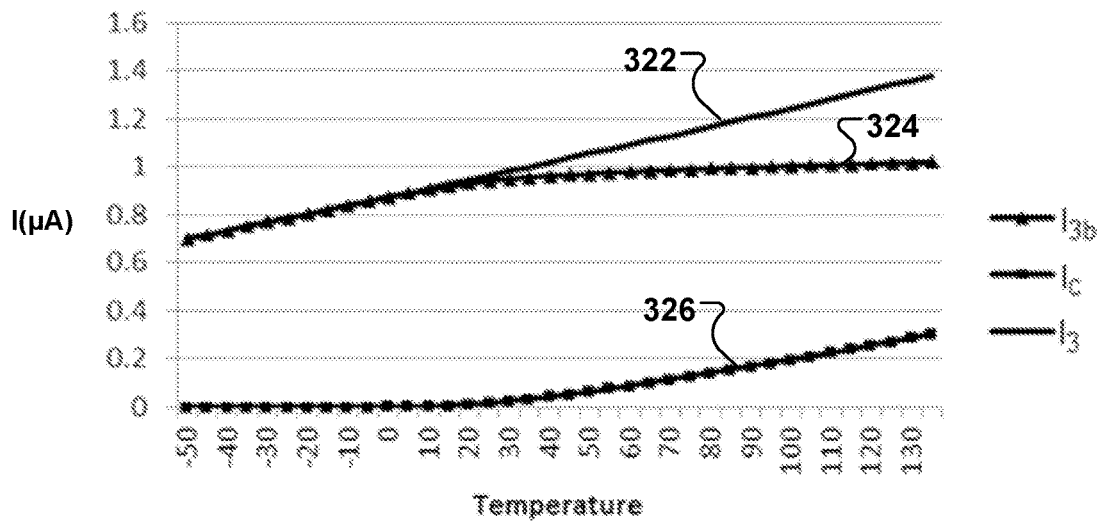
FIG. 3C shows changes of different currents in the bandgap reference circuit of FIG. 2 over a range of temperatures when the bandgap reference voltage is lower than the turn-on voltage of the bipolar junction transistor (BJT).
Figure 3D:
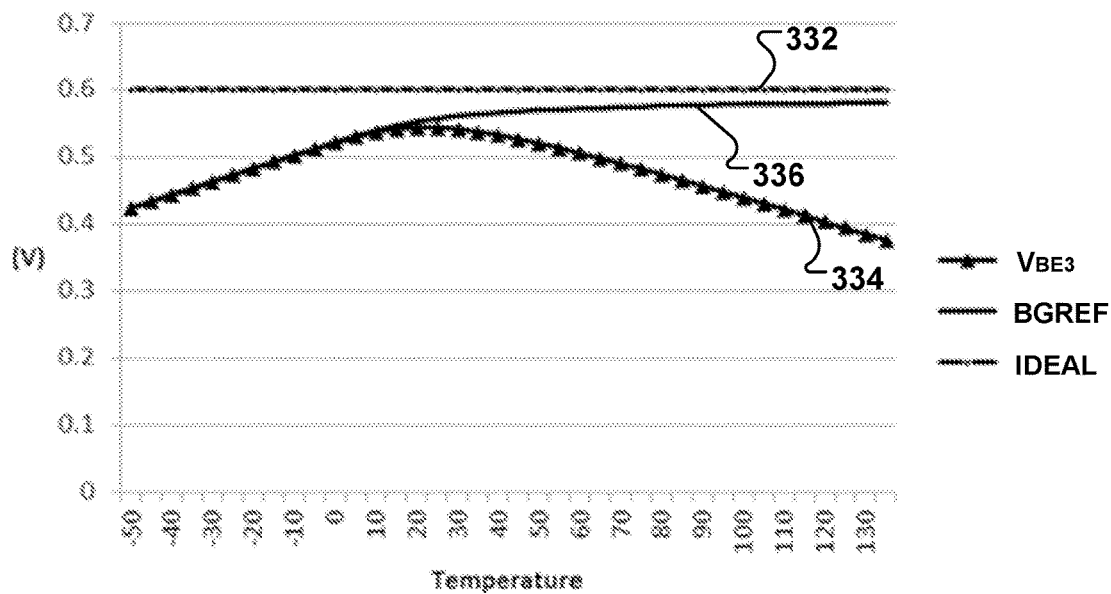
FIG. 3D shows changes of an emitter-base voltage ($V_{BE}$) of the bipolar junction transistor (BJT) in the bandgap reference circuit of FIG. 2 over a range of temperatures when the bandgap reference voltage is lower than the turn-on voltage of the bipolar junction transistor (BJT).

Diagrams 320 and 330 of FIGS. 3C and 3D show the changes of the different currents ($I_3$, $I_{3b}$, $I_C$) and the changes of the emitter-base voltage $V_{BE3}$ and the bandgap reference voltage BGREF over the range of temperatures (e.g., from −50° C. to 135° C.), when BGREF is designed to be lower than the turn-on voltage of the BJT 242. For example, the turn-on voltage of the BJT 242 is 0.7V, and the BGREF is designed to be 0.6V by increasing a ratio of $R_2/R_3$ to 1. Plots 322, 324, 326 show the changes of $I_3$, $I_{3b}$, and $I_C$, respectively. Plot 326 shows that the BJT current $I_C$ is too low at low temperatures, e.g., close to zero from −50° C. to more than 20° C., which produces non-ideal effects on the BJT 242. Plot 332 shows an ideal condition for BGREF, which keeps constant over the range of temperatures. Plots 334 and 336 respectively show the changes of $V_{BE3}$ and BGREF over the range of temperatures. It is shown that the BGREF cannot be lower than the $V_{BE3}$ of the BJT 242, as illustrated in FIG. 3D. At low temperatures, e.g., below 10° C., BGREF is no higher than $V_{BE3}$, resulting in the BJT 242 no current (i.e., $I_C=0$), which makes the bandgap reference circuit 200 unable to operate normally.

Implementations of the present disclosure provide bandgap reference circuits with current compensation technology, for example, by adding a compensation circuitry to mirror a current from a reference current path, which can be used to compensate a BJT current of a corresponding BJT such that the corresponding BJT can still have a linear negative temperature coefficient curve at low temperatures. Accordingly, the bandgap reference voltage circuits can reduce a variation of a bandgap reference voltage and obtain the bandgap reference voltage at a low voltage level, e.g., lower than a turn-on voltage of the corresponding BJT.

Figure 4:
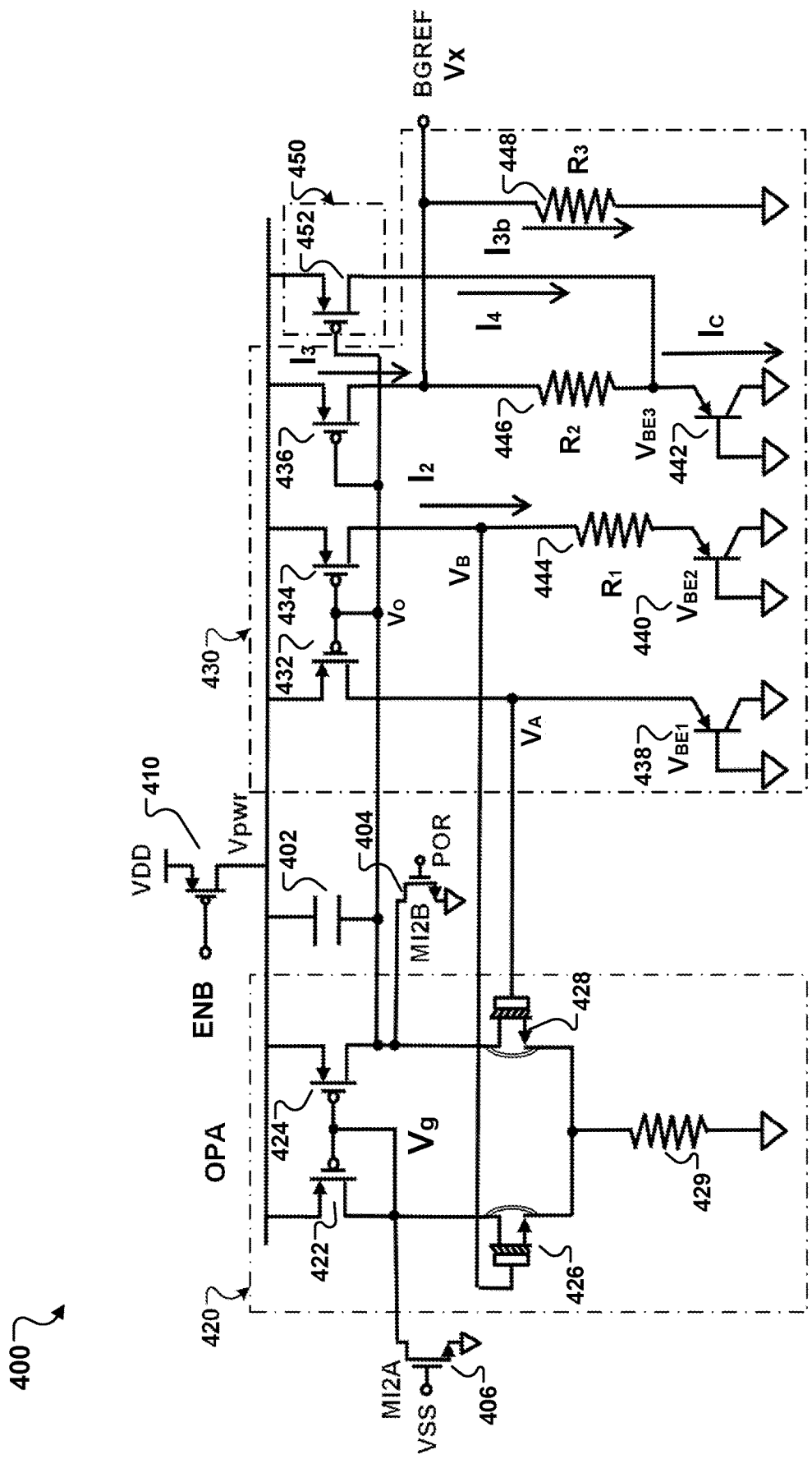
FIG. 4 illustrates a circuit diagram of an example of a bandgap reference circuit with current compensation, according to one or more implementations of the present disclosure.

FIG. 4 illustrates a circuit diagram of an example of a bandgap reference circuit 400 with current compensation, according to one or more implementations of the present disclosure. The bandgap reference circuit 400 can provide the reference voltage circuit 118 of FIG. 1. The bandgap reference circuit 400 can provide a stable bandgap reference voltage BGREF to a memory controller, e.g., the device controller 112 of FIG. 1, for performing operations on a memory, e.g., the memory 116 of FIG. 1. In contrast to the bandgap reference circuit 200 of FIG. 2, the bandgap reference circuit 400 can reduce a variation of the bandgap reference voltage and obtain the bandgap reference voltage at a low voltage level, e.g., lower than a turn-on voltage of a BJT.

Similar to the bandgap reference circuit 200 of FIG. 2, the bandgap reference circuit 400 includes an operational amplifier (OPA) 420 and output circuitry 430. However, different from the bandgap reference circuit 200 of FIG. 2, the bandgap reference circuit 400 includes a compensation circuitry configured to compensate the output circuitry 430 with a compensation current, e.g., $I_4$, corresponding to a current, e.g., $I_3$, in the output circuitry 430.

In some implementations, compared to the bandgap reference circuit 200 configured to directly receive an original supply voltage VDD, the bandgap reference circuit 400 includes a power supply switch configured to receive the original supply voltage VDD and generate a controlled supply voltage Vpwr based on the original supply voltage VDD. In some implementations, the power supply switch includes a power transistor 410, e.g., a PMOS transistor. The power transistor 410 is configured to receive the original supply voltage VDD at a source and an enable signal ENB at a gate and output the controlled supply voltage Vpwr at a drain. When the ENB signal is at a high voltage level, the power transistor 410 is turned off and blocks the supply voltage VDD to the other components in the bandgap reference circuit 400; when the ENB signal is at a low voltage level, the power transistor 410 is turned on and provides the controlled supply voltage Vpwr to the other components in the bandgap reference circuit 400. In such a way, the bandgap reference circuit 400 can have low power consumption and eliminate leakage.

The bandgap reference circuit 400 can include a coupling capacitor 402 having a first end coupled to the drain of the power transistor 410 for receiving the controlled supply voltage Vpwr and a second end coupled to the gates of the p-channel transistors 432, 434, 436 of the output circuitry 430. The coupling capacitor is configured to associate a gate control voltage Vo with the controlled supply voltage Vpwr. By configuring the coupling capacitor 402, the gate control voltage Vo can be substantially proportional to the controlled supply voltage Vpwr. Thus, when the controlled supply voltage Vpwr is 0 V, the gate control voltage is also 0 V. When the controlled supply voltage Vpwr ramps up, the gate control voltage Vo can be quickly coupled high by the coupling capacitor 402. In some examples, the coupling capacitor 402 is a transistor, e.g., an MOS transistor, having its source and drain coupled together as the first end coupled to the power supply switch (e.g., the power transistor 410) and its gate as the second end coupled to the gates of the p-channel transistors in the output circuitry 430. In some examples, the coupling capacitor 402 is a metal-insulator-metal capacitor (MIMCAP), a metal-oxide-silicon capacitor (MOSCAP), or a metal-oxide-semiconductor field-effect transistor capacitor (MOSFET CAP).

The bandgap reference circuit 400 can also include a startup circuit that can include a transistor (MI2B) 404, e.g., an NMOS transistor. The transistor 404 can be configured to receive a power-on rest (POR) signal as a startup signal to startup the bandgap reference circuit 400. The transistor 404 can include a gate for receiving the POR signal, a source coupled to a ground, and a drain coupled to the OPA 420 and the output circuitry 430. After the bandgap reference circuit 400 is started up, the POR signal can be off.

If the transistor (MI2B) 404 has a leakage, the leakage can cause currents on the two n-channel transistors 426 and 428, which can cause a mismatch. In some implementations, as illustrated in FIG. 4, the bandgap reference circuit 400 includes a corresponding start signal circuit including a transistor (MI2A) 406, e.g., an NMOS transistor. The transistor (MI2A) 406 can include a gate for receiving a voltage VSS (e.g., 0 V or the ground voltage), a source coupled to the ground, and a drain coupled to the OPA 420, e.g., to a connection point between the drain of the p-channel transistor 422 and the drain of the n-channel transistor 426. The transistor (MI2A) 406 can have the same characteristics as the transistor (MI2B) 404, such that the OPA 420 can be balanced for startup and for avoiding the mismatch on the two n-channel transistors 426 and 428 and/or the two p-channel transistors 422 and 424.

In some implementations, as shown in FIG. 4, the OPA 420 and the output circuitry 430 are coupled with each other, where the OPA 420 is configured to provide the gate control voltage Vo to the output circuitry 430, and the output circuitry 430 is configured to provide input voltages $V_A$ and $V_B$ into respective inputs of the OPA 420.

The OPA 420 can be any suitable type of OPA, such as a folded-cascode OPA or a two-stage OPA. In some implementations, the OPA 420 includes two p-channel transistors 422 and 424, e.g., PMOS transistors, two n-channel transistors 426 and 428, e.g., NMOS transistors, and a current transistor 429. The p-channel transistors 422 and 424 have their gates coupled together to a drain of the p-channel transistor 422 and their sources coupled together to receive the controlled supply voltage Vpwr. The drain of the p-channel transistor 422 is coupled to a drain of the n-channel transistor 426. A drain of the p-channel transistor 424 is coupled to a drain of the n-channel transistor 428. Sources of the two n-channel transistors 426 and 428 are coupled together to the current transistor 429 configured for biasing current and coupled to the ground. Gates of the two n-channel transistors 426 and 428 are two inputs of the OPA 420 and configured to receive the respective input voltages $V_A$ and $V_B$ from the output circuitry 430.

In some implementations, the output circuitry 430 includes three p-channel transistors 432, 434, 436, e.g., PMOS transistors, and three bipolar junction transistors (BJTs) 438, 440, 442, e.g., PNP BJTs. Sources of the p-channel transistors 432, 434, 436 are connected together to receive the controlled supply voltage Vpwr. Gates of the p-channel transistors 432, 434, 436 are connected together to the drain of the p-channel transistor 424 in the OPA 420. Thus, the gate control voltage Vo can be considered as an output of the OPA 420. A drain of the p-channel transistor 432 is configured to provide the input voltage $V_A$ to the gate of the n-channel transistor 428 of the OPA 420, and a drain of the p-channel transistor 434 is configured to provide the input voltage $V_B$ to the gate of the n-channel transistor 426 of the OPA 420. The gates of n-channel transistors 426 and 428 are two inputs of the OPA 420 and can be pulled to a substantially same voltage due to a function of the OPA 420. An emitter of the BJT 438 is connected to the drain of the p-channel transistor 432, and a base and a collector of the BJT 438 are both coupled to the ground. An emitter of the BJT 440 is connected to the drain of the p-channel transistor 434 through a resistor 444 with a resistance of $R_1$, and a base and a collector of the BJT 440 are both coupled to the ground. An emitter of the BJT 442 is connected to the drain of the p-channel transistor 436 through a resistor 446 with a resistance of $R_2$, and a base and a collector of the BJT 442 are both coupled to the ground. The bandgap reference circuit 200 is configured to output the bandgap reference (BGREF) voltage Vx at a connection point between the drain of the p-channel transistor 436 and the resistor 446.

The output circuitry 430 is configured to stabilize the bandgap reference voltage such that the bandgap reference voltage can be substantially independent from temperature, process corner, and/or voltage. In a particular example, the output circuitry 430 is configured such that the bandgap reference voltage is independent from PVT effect.

In some implementations, the p-channel transistors 432, 434, the BJTs 438, 440, and the resistor 444 form a proportional to absolute temperature (PTAT) circuit configured together to be positively affected by temperature (e.g., to have a current associated with a positive temperature coefficient). A current I2 flows in the PTAT circuit is considered as a PTAT current. The BJT 442 forms a complementary to absolute temperature (CTAT) circuit and is configured to be negatively affected by temperature (e.g., to have a current $I_C$ associated with a negative temperature coefficient). The BJT 442 is for CTAT voltage generation. The p-channel transistor 436, the BJT 442, and the resistor 446 are configured for zero to absolute temperature (ZTAT) voltage generation and configured together not to be affected by temperature. In such a way, the output circuitry 430 can be configured to stabilize the bandgap reference voltage independent from temperature (e.g., to have a current with zero temperature coefficient). The transistors in the output circuitry 430 can be fabricated during a same process such that the effect of process corner can be suppressed or eliminated.

A current $I_3$ flowing from the p-channel transistor 436 can mirror or be substantially identical to the PTAT current $I_2$ on the resistor 444. In some implementations, the current $I_3$ is identical to the PTAT current $I_2$. The current $I_3$ can be expressed as:

$$I_3 = (V_{BE1} - V_{BE2})/R_1 = \Delta V_{BE}/R_1 \qquad (1),$$

where $V_{BE1}$ is an emitter-base-base voltage that falls between the emitter and base of the BJT 438, and $V_{BE2}$ is an emitter-base-base voltage that falls between the emitter and base of the BJT 440. The BJT 438 and BJT 440 can have a different characteristic, e.g., including a different number of transistors, to cause a difference $\Delta V_{BE}$ on the emitter-base voltages.

As noted above, the bandgap reference circuit 400 can include a compensation circuitry 450 configured to compensate a BJT current $I_C$ through the BJT 442 with a compensation current $I_4$, such that the BJT 442 can still have a linear negative temperature coefficient at low temperatures.

In some implementations, as illustrated in FIG. 4, the compensation circuitry 450 is configured to mirror the current $I_3$ in the output circuitry 430. The compensation circuitry 450 can include a p-channel transistor 452 that can have same characteristics as the p-channel transistor 436. The p-channel transistor 452 includes a source coupled to the controlled supply voltage Vpwr, same as the source of the p-channel transistor 436; a gate coupled to the output of the OPA 420 to receive the gate control voltage Vo, same as the gate of the p-channel transistor 436; and a drain coupled to the emitter of the BJT 442. A compensation current $I_4$ flowing from the p-channel transistor 452 can correspond to the current $I_3$. In some examples, $I_4$ is identical to $I_3$. In some examples, $I_4$ is proportional to $I_3$, e.g., $I_4:I_3=1:4$, 1:3, or 1:2.

Figure 5:
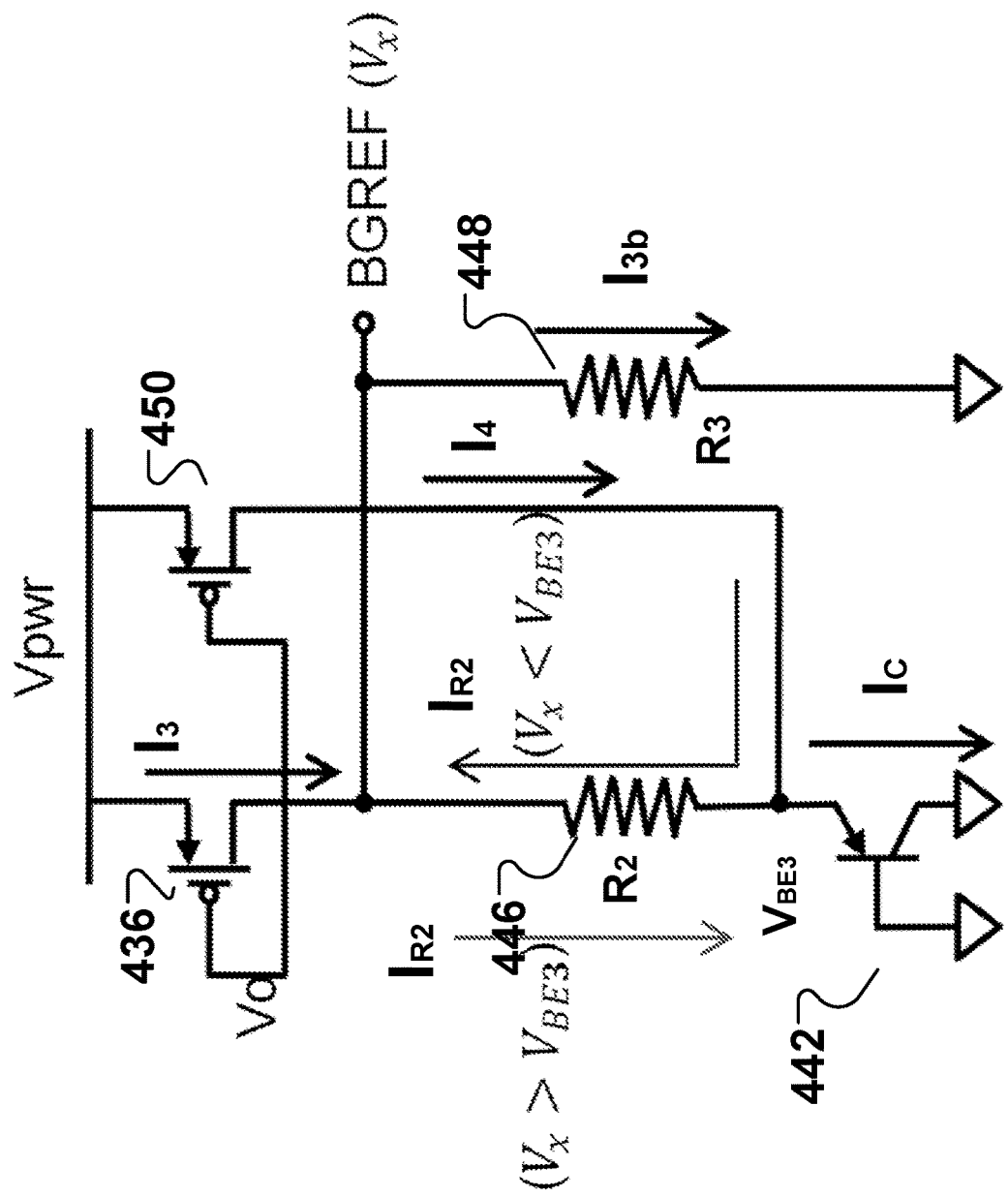
FIG. 5 illustrates a different current flow direction when a bandgap reference voltage of a bandgap reference circuit is larger or smaller than a turn-on voltage of a bipolar junction transistor (BJT), according to one or more implementations of the present disclosure.

In some implementations, the bandgap reference circuit 400 is configured such that the bandgap reference voltage BGREF Vx is higher than a turn-on voltage of the BJT 442, e.g., $V_x > V_{BE3}$. As shown in FIG. 5, the compensation current $I_4$ from the compensation circuitry 450 (e.g., through the p-channel transistor 452) flows into the BJT 442. The current $I_3$ from the p-channel 436 is split into a first current $I_{R2}$ through the resistor 446 into the BJT 442 and a second part $I_{3b}$ through the resistor 448 to the ground. Thus, the BJT current $I_C$ through the BJT 442 can be associated with $I_{R2}$ and $I_4$. As $I_3 = I_{R2} + I_{3b}$, the following expression can be obtained:

$$I_3 - I_{R2} - I_{3b} = \frac{\Delta V_{BE}}{R_1} - \frac{V_x - V_{BE3}}{R_2} - \frac{V_x}{R_3} = 0. \quad (2)$$

Accordingly, the bandgap reference voltage Vx can be expressed as:

$$V_x = \frac{R_3}{R_2 + R_3}\left(V_{BE3} + \frac{R_2}{R_1}\Delta V_{BE}\right). \quad (3)$$

In some implementations, the bandgap reference circuit 400 is configured such that the bandgap reference voltage BGREF Vx is lower than the turn-on voltage of the BJT 442, i.e., $V_x < V_{BE3}$. As shown in FIG. 5, the compensation current $I_4$ from the compensation circuitry 450 (e.g., through the p-channel transistor 452) is split into $I_C$ into the BJT 442 and the current $I_{R2}$ through the resistor 446. That is, the compensation current $I_4$ can compensate the current $I_C$ so that the BJT 442 can operate properly when the bandgap reference voltage Vx is lower than the turn-on voltage of the BJT 442. The current $I_3$ from the p-channel 436 and the current $I_{R2}$ through the resistor 446 are combined into the current $I_{3b}$ through the resistor 448 to the ground. Thus, $I_{3b} = I_3 + I_{R2}$, and the following expression can be obtained:

$$I_3 + I_{R2} - I_{3b} = \frac{\Delta V_{BE}}{R_1} + \frac{V_{BE3} - V_x}{R_2} - \frac{V_x}{R_3} = 0. \quad (4)$$

Accordingly, the bandgap reference voltage Vx can be expressed as:

$$V_x = \frac{R_3}{R_2 + R_3}\left(V_{BE3} + \frac{R_2}{R_1}\Delta V_{BE}\right). \quad (5)$$

Expressions (3) and (5) show that, with the compensation circuitry, the bandgap reference voltage Vx has the same expression, and the bandgap reference circuit 400 can operate properly whenever the bandgap reference voltage Vx is higher or lower than the turn-on voltage of the BJT 442. Thus, the bandgap reference voltage Vx can be designed or configured to be a desired voltage level according to the expression (3) or (5), e.g., to be higher or lower than the turn-on voltage of the BJT 442.

The bandgap reference circuit 400 is configured such that the difference $\Delta V_{BE}$ of the emitter-base voltages of the BJT 438 and BJT 440 has a positive temperature coefficient, and the emitter-base voltage $V_{BE3}$ of the BJT 442 has a negative temperature coefficient. Thus, as the expressions (3) and (5) show, the bandgap reference voltage Vx can be independent from the temperature (T). The BJTs 438, 440, and 442 can be configured, e.g., fabricated from the same process, such that the bandgap reference voltage Vx is independent from process corners and voltages. Thus, the bandgap reference voltage can be stable and independent from temperatures, process corners, and/or voltages, or PVT (process-voltage-temperature) effect. That is, the bandgap reference voltage Vx can be kept substantially constant under different process corners, different temperatures, different voltages, and/or different PVT effects.

In some examples, the turn-on voltage of the BJT 442 is about 0.7 V.

$$V_{BE3} + \frac{R_2}{R_1}\Delta V_{BE}$$

can be constant and identical to 1.2V. When $R_3/R_2 = 2$, the bandgap reference voltage Vx can be designed to be 0.8V according to expression (3), which is higher than the turn-on voltage of the BJT 442.

Figure 6A:
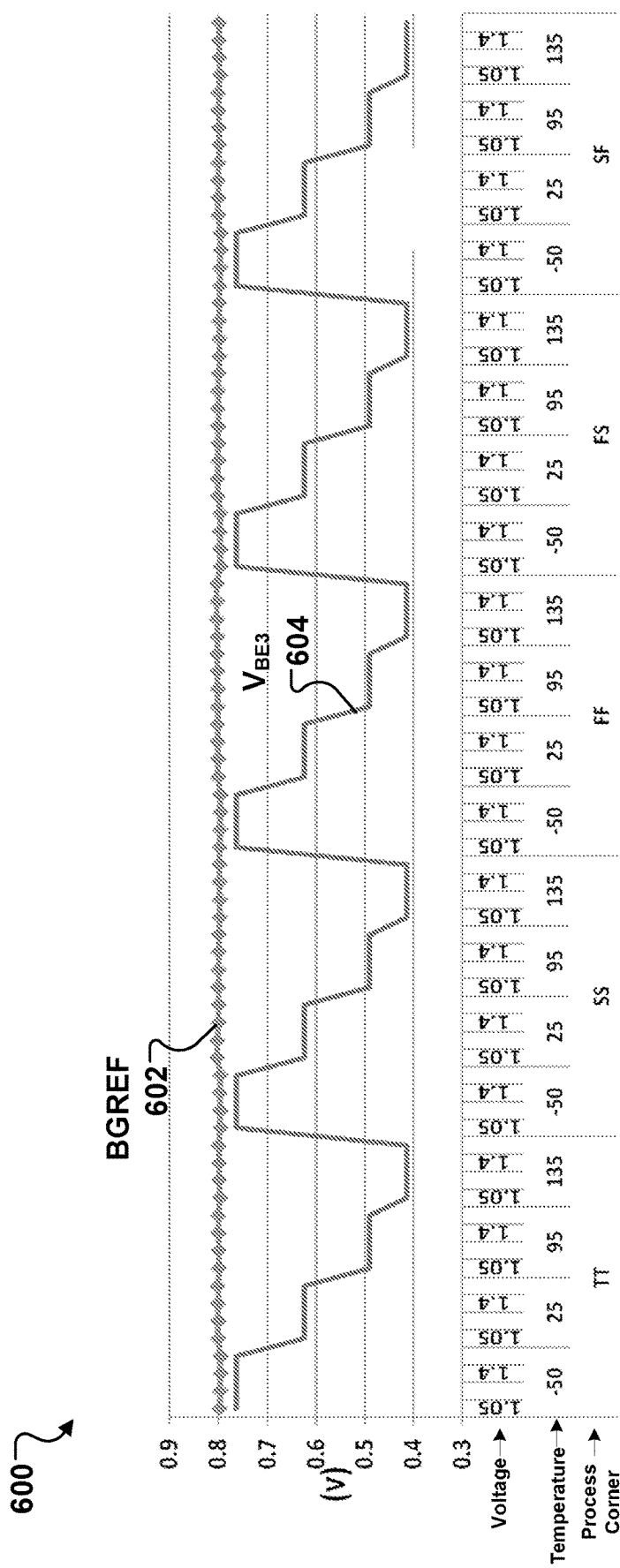
FIG. 6A illustrates changes of a bandgap reference voltage and an emitter-base voltage of a corresponding BJT in a bandgap reference circuit under PVT effects when the bandgap reference voltage is higher than a turn-on voltage of the corresponding BJT, according to one or more implementations of the present disclosure.

FIG. 6A illustrates an example 600 of changes of the bandgap reference voltage Vx and the emitter-base voltage $V_{BE3}$ of the BJT 442 under different PVT effects. The different PVT conditions are illustrated in different rows of x coordinates. The first row represents voltage, which varies within in a range from 1.05V to 1.6V. The second row represents temperature, which is set to vary among four values (−50° C., 25° C., 90° C., and 135° C.). The third row represents a process corner variation, which can be TT, SS, FF, FS or SF. Note that SS corner stands for slow NMOS and slow PMOS case, FF corner stands for fast NMOS and fast PMOS case, SF corner stands for slow NMOS and fast PMOS case, FS corner stands for fast NMOS and slow PMOS case, and TT stands for typical NMOS and typical PMOS case that is an ideal or desired case. Plot 602 in FIG. 6A shows that the bandgap reference voltage Vx keeps substantially constant at 0.8 V with a small variation of about 7.4 mV in different PVT conditions. Plot 604 in FIG. 6A shows that $V_{BE3}$ of the BJT 442 is lower than the bandgap reference voltage Vx and inversely varies with different temperatures, and substantially independent from the processor corners and voltages.

In some examples, the turn-on voltage of the BJT 442 is about 0.7 V.

$$V_{BE3} + \frac{R_2}{R_1}\Delta V_{BE}$$

can be constant and identical to 1.2V. When $R_3/R_2 = 1$, the bandgap reference voltage Vx can be designed to be 0.6V according to expression (5), which is lower than the turn-on voltage of the BJT 442.

Figure 6B:
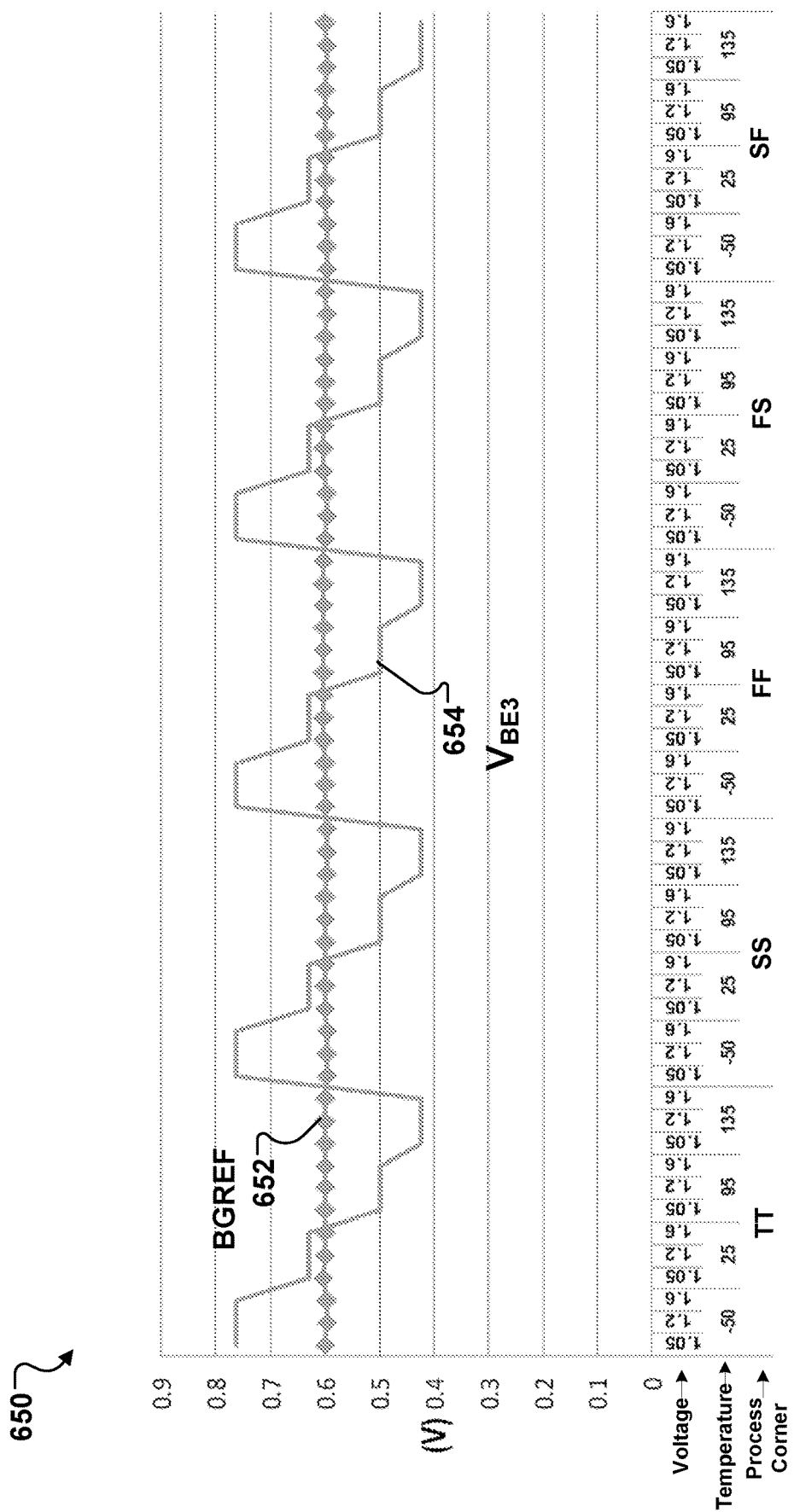
FIG. 6B illustrates changes of a bandgap reference voltage and an emitter-base voltage of a corresponding BJT in a bandgap reference circuit under PVT effects when the bandgap reference voltage is lower than a turn-on voltage of the corresponding BJT, according to one or more implementations of the present disclosure.

FIG. 6B illustrates an example 650 of changes of the bandgap reference voltage Vx and the emitter-base voltage $V_{BE3}$ of the BJT 442 under different PVT effects. The different PVT conditions are illustrated in different rows of x coordinates. The first row represents voltage, which varies within in a range from 1.05V to 1.6V. The second row represents temperature, which is set to vary among four values (−50° C., 25° C., 90° C., and 135° C.). The third row represents a process corner variation, which can be TT, SS, FF, FS or SF. Plot 652 in FIG. 6B shows that the bandgap reference voltage Vx keeps substantially constant at 0.6V with a small variation of about 4.5 mV in different PVT conditions. Plot 654 in FIG. 6B shows that $V_{BE3}$ of the BJT 442 inversely varies with different temperatures, and substantially independent from the processor corners and voltages.

Figure 7A:
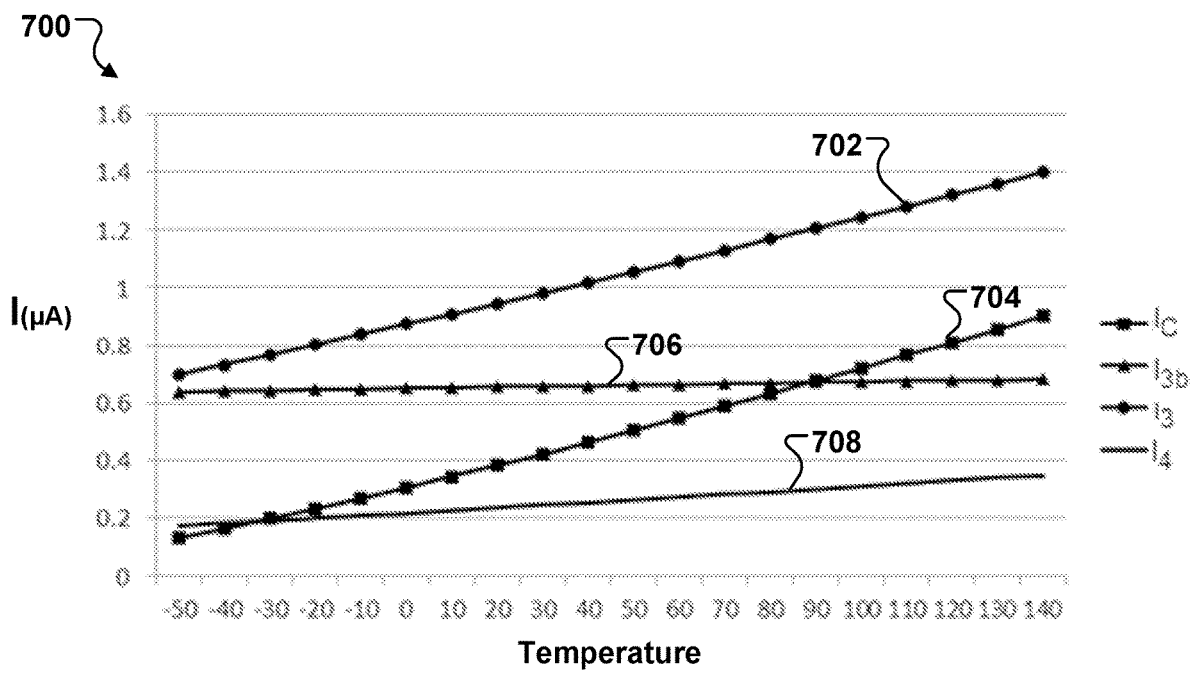
FIG. 7A shows changes of different currents in the bandgap reference circuit of FIG. 4 over a range of temperatures, according to one or more implementations of the present disclosure.

FIG. 7A shows an example 700 of changes of different currents ($I_3$, $I_C$, $I_{3b}$, $I_4$) in the bandgap reference circuit 400 of FIG. 4 over a range of temperatures, e.g., from −50° C. to 135° C., when the bandgap reference voltage BGREF Vx (e.g., 0.8V) is higher than the turn-on voltage (e.g., 0.7V) of the BJT 442. Plots 702, 704, 706 and 708 show the changes of $I_3$, $I_C$, $I_{3b}$, and $I_4$, respectively. Plot 708 shows that $I_4$ is substantially proportional to $I_3$, e.g., $I_4:I_3=1:4$, and varies correspondingly with $I_3$. The current $I_{3b}$ through the resistor $R_3$ keeps substantially constant, which indicates that the bandgap reference voltage Vx keeps substantially constant. With the compensation of the current $I_4$, the BJT current $I_C$ is larger than zero at low temperatures and positively increases with the temperature, so that the BJT 442 can still have a linear negative temperature coefficient at low temperatures. As shown in a diagram 710 of FIG. 7B, a linear curve 714 represents an ideal condition where an emitter-base voltage $V_{BE}$ decreases linearly with an increase of the temperature, and plot 712 of the emitter-base voltage $V_{BE3}$ of the BJT 442 fits well with the linear curve 714, which indicates that the BJT 442 operates properly with the compensation current $I_4$. In contrast, as shown in FIG. 3B, the plot 312 of $V_{BE3}$ of the BJT 242 in the bandgap reference circuit 200 of FIG. 2 becomes non-linear under low temperatures, which indicates that the BJT 242 in the bandgap reference circuit 200 without a compensation circuitry does not operate properly under the low temperatures.

Figure 8:
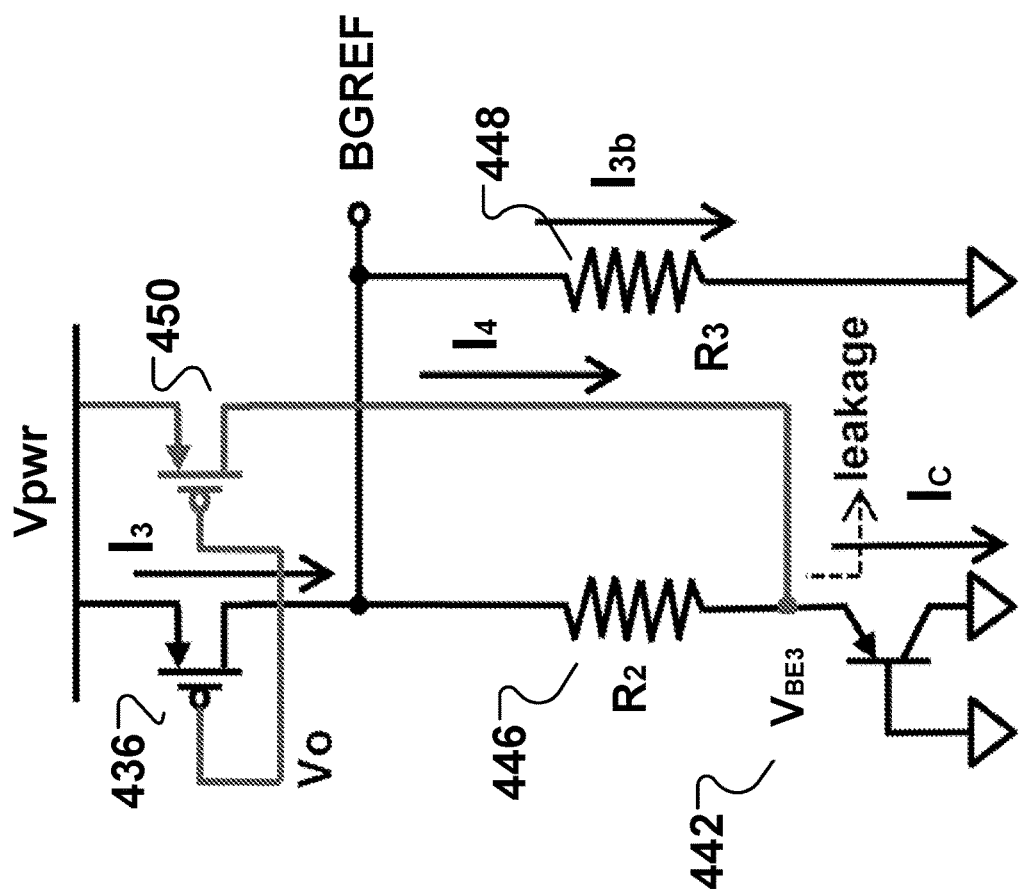
FIG. 8 illustrates an enlarged view of a compensation circuitry in the bandgap reference circuit of FIG. 4, according to one or more implementations of the present disclosure.
Figure 9A:
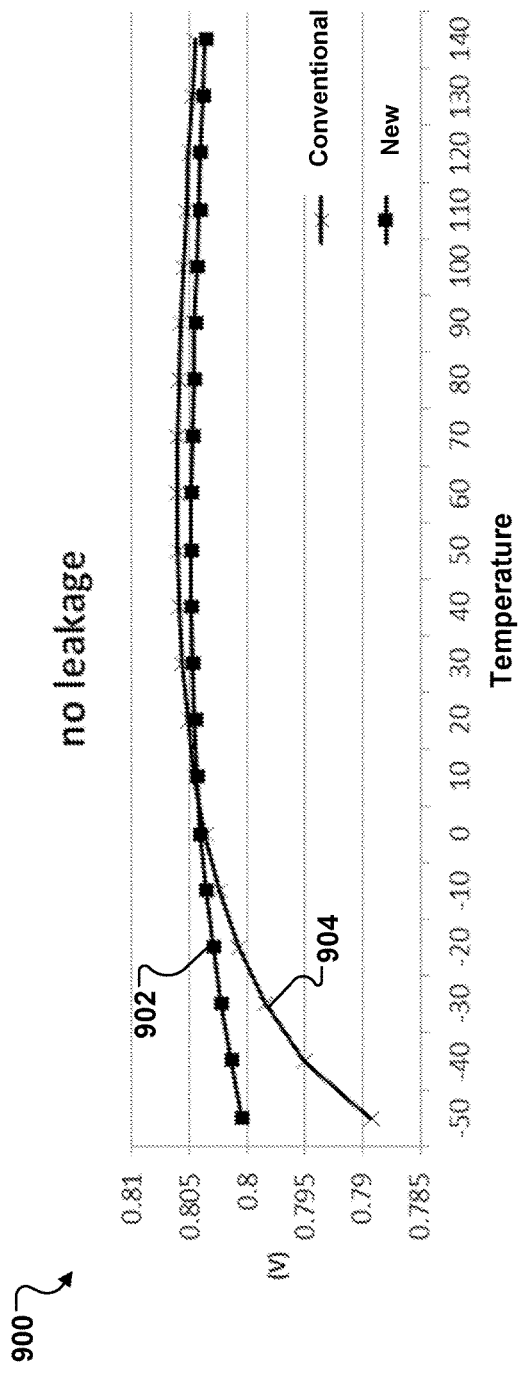
FIGS. 9A-9B illustrate changes of bandgap reference voltages in the bandgap reference circuits of FIGS. 2 and 4 over a range of temperatures when a corresponding BJT has no leakage (FIG. 9A) and has leakage (FIG. 9B).

FIG. 8 is an enlarged view of the compensation circuitry 450 of the bandgap reference circuit 400 of FIG. 4. As illustrated in FIG. 8, a current leakage may occur at the BJT 442. FIG. 9A illustrate an example 900 of a change of the bandgap reference voltage BGREF Vx in the bandgap reference circuit 400 of FIG. 4 over a range of temperatures (e.g., −50° C. to 135° C.) when the BJT 442 has no leakage. Plot 902 shows that the bandgap reference voltage Vx of the bandgap reference circuit 400 keeps substantially constant at 0.8V over the range of temperatures with a variation less than 5 mV. In comparison, a change of the bandgap reference voltage of the bandgap reference circuit 200 of FIG. 2 over the range of temperatures is also shown as plot 904 in FIG. 9A, which indicates that the bandgap reference voltage of the bandgap reference circuit 200 has a larger variation under low temperatures, more than 15 mV.

Figure 9B:
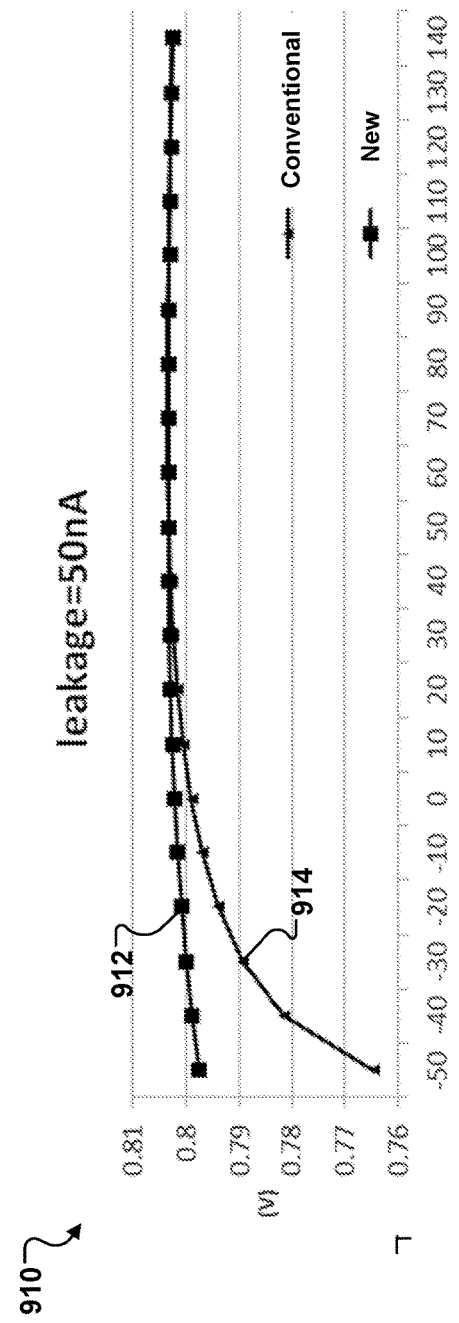

FIG. 9B illustrate an example 910 of the change of the bandgap reference voltage BGREF Vx in the bandgap reference circuit 400 of FIG. 4 over the range of temperatures (e.g., −50° C. to 135° C.) when the BJT 442 has a current leakage of 50 nA. Plot 912 shows that the bandgap reference voltage Vx of the bandgap reference circuit 400 keeps substantially constant at 0.8V over the range of temperatures with a variation less than 5 mV. In comparison, the change of the bandgap reference voltage of the bandgap reference circuit 200 of FIG. 2 over the range of temperatures is also shown as plot 914 in FIG. 9B, which indicates that the bandgap reference voltage of the bandgap reference circuit 200 has a larger variation under low temperatures, more than 35 mV. Thus, with the compensation circuitry 450, the bandgap reference circuit 400 can generate the bandgap reference voltage with much less variation than the bandgap reference circuit 200 of FIG. 2, no matter whether or not there is a leakage current at the BJT 442.

Figure 10:
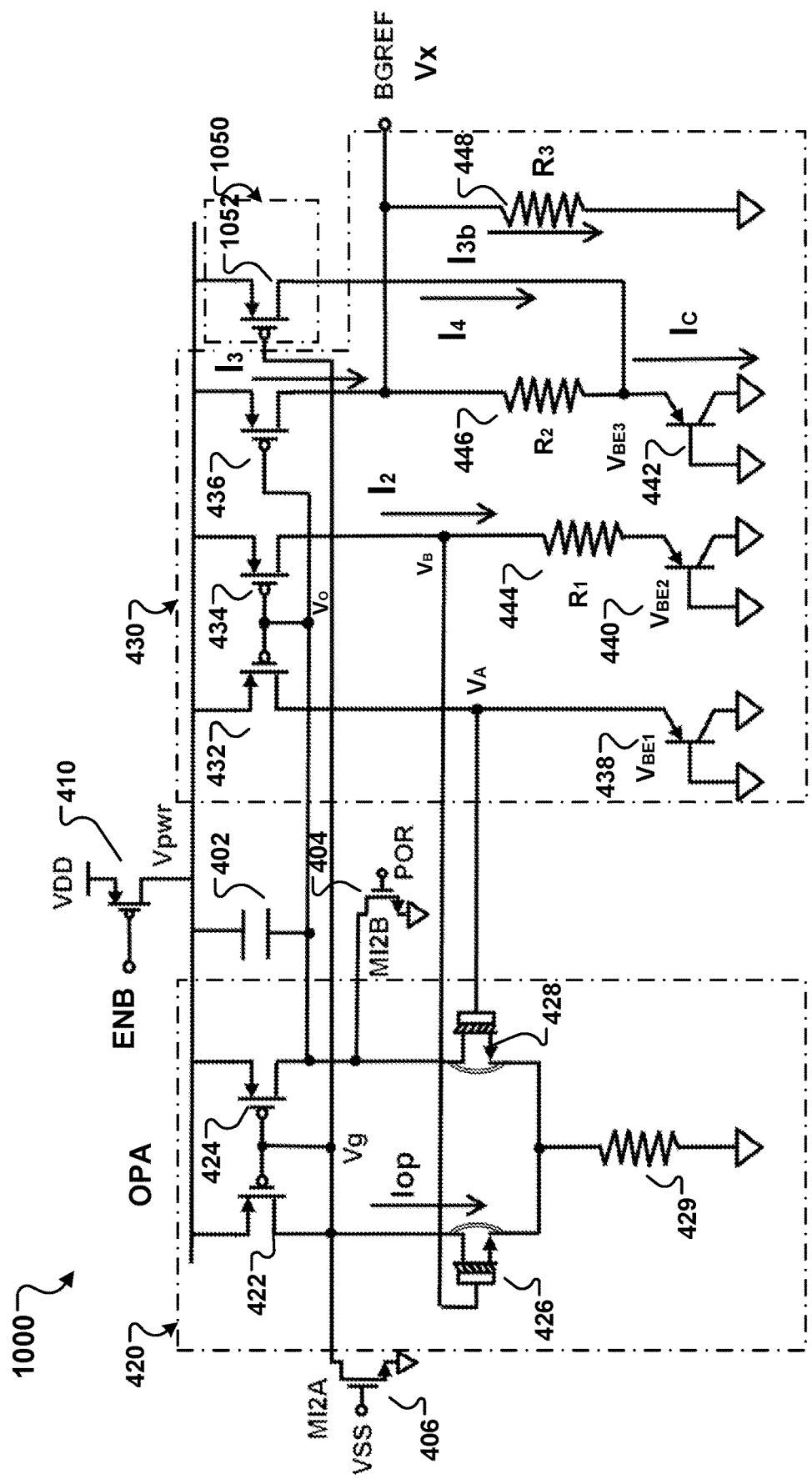
FIG. 10 illustrates a circuit diagram of another example of a bandgap reference circuit with current compensation, according to one or more implementations of the present disclosure.

FIG. 10 illustrates a circuit diagram of another example of a bandgap reference circuit 1000 with current compensation, according to one or more implementations of the present disclosure. The bandgap reference circuit 1000 can provide the reference voltage circuit 118 of FIG. 1. The bandgap reference circuit 1000 can provide a stable bandgap reference voltage BGREF to a memory controller, e.g., the device controller 112 of FIG. 1, for performing operations on a memory, e.g., the memory 116 of FIG. 1. The bandgap reference circuit 1000 can have the similar configuration as the bandgap reference circuit 400 of FIG. 4. For simplicity, the same components in the bandgap reference circuits 1000 and 400 have the same labels.

Compared to the bandgap reference circuit 400 of FIG. 4 in which the compensation circuitry 450 mirrors a current path associated with the current I3, the bandgap reference circuit 1000 includes a compensation circuitry 1050 that is configured to mirror a current path in the OPA 420. As illustrated in FIG. 10, the compensation circuitry 1050 includes a p-channel transistor 1052 that can have same characteristics as the p-channel transistors 422 and 424. The p-channel transistor 1052 can include a source coupled to the controlled supply voltage Vpwr, same as the source of the p-channel transistor 422 or 424. A gate of the p-channel transistor 1052 can be coupled to the drain of the transistor (MI2A) 406 to receive the gate voltage Vg, same as the gate of the p-channel transistors 422 and 424. A drain of the p-channel transistor 1052 is coupled to the emitter of the BJT 442 to provide a compensation current $I_4$ to the BJT 442. The compensation current $I_4$ can correspond to a current Iop. In some examples, $I_4$ is identical to Iop. In some examples, $I_4$ is proportional to Iop, e.g., $I_4:Iop=1:2$, 1:3, or 1:4.

Figure 11A:
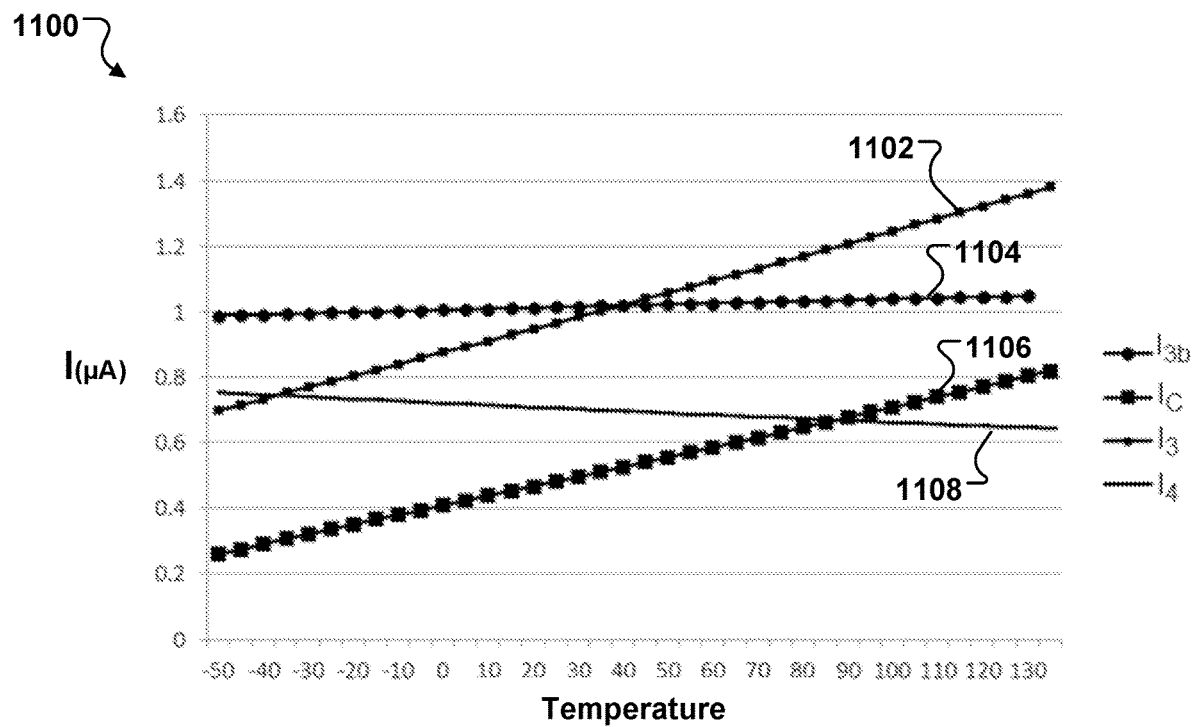
FIG. 11A shows changes of different currents in the bandgap reference circuit of FIG. 10 over a range of temperatures, according to one or more implementations of the present disclosure.

FIG. 11A shows an example 1100 of changes of different currents ($I_3$, $I_{3b}$, $I_C$, $I_4$) in the bandgap reference circuit 1000 of FIG. 10 over a range of temperatures, e.g., from −50° C. to 135° C., when the bandgap reference voltage BGREF $V_x$ (e.g., 0.8V) is higher than the turn-on voltage (e.g., 0.7V) of the BJT 442. Plots 1102, 1104, 1106 and 1108 show the changes of $I_3$, $I_{3b}$, $I_C$, and $I_4$, respectively. Plot 1104 shows that the current $I_{3b}$ through the resistor $R_3$ keeps substantially constant, which indicates that the bandgap reference voltage Vx of the bandgap reference circuit 1000 keeps substantially constant. With the compensation of the current $I_4$, the BJT current $I_C$ is larger than zero at low temperatures and positively increases with the temperature, so that the BJT 442 in the bandgap reference circuit 1000 can still have a linear negative temperature coefficient at low temperatures. As shown in a diagram 1110 of FIG. 11B, a linear curve 1114 represents an ideal condition where an emitter-base voltage $V_{BE}$ decreases linearly with an increase of the temperature, and plot 1112 of the emitter-base voltage $V_{BE3}$ of the BJT 442 in the bandgap reference circuit 1000 fits well with the linear curve 1114, which indicates that the BJT 442 in the bandgap reference circuit 1000 operates properly with the compensation current $I_4$.

In some implementations, the compensation circuitry 1050 in the bandgap reference circuit 1000 can include one or more transistors. For example, when the OPA 420 is a folded-cascode OPA or two-stage OPA, the compensation circuitry 1050 can also have a similar configuration to the OPA 420 and include two or more transistors configured in a folded-cascode form or two-stage form.

In some implementations, a bandgap reference circuit in a memory system can include a compensation circuitry that is configured to mirror a current path in an external circuit in the memory system. A compensation current in the compensation circuitry can correspond to a current in the stable current path and is provided to compensate with a BJT current of a corresponding BJT in the bandgap reference circuit.

Figure 12:
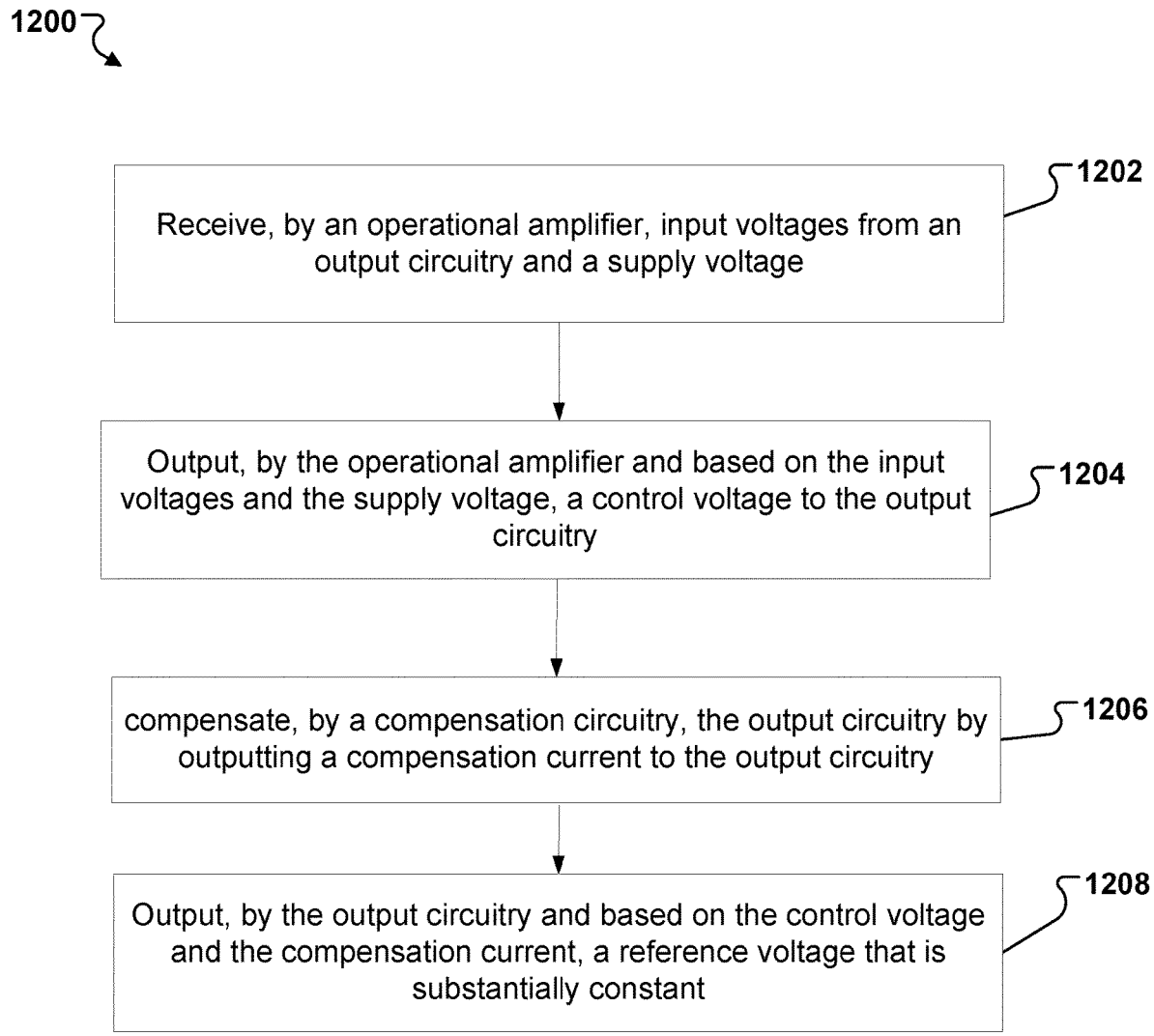
FIG. 12 illustrates a flow chart of an example of a process for managing reference voltages with current compensation, according to one or more implementations of the present disclosure.

FIG. 12 illustrates a flow chart of an example of a process 1200 for managing a reference voltage of a reference voltage circuit in a memory system, according to one or more implementations. The memory system can be the device 110 of FIG. 1. The reference voltage circuit can be the reference voltage circuit 118 of FIG. 1, or the bandgap reference circuit 400 of FIG. 4 or the bandgap reference circuit 1000 of FIG. 10. The reference voltage circuit can be configured to provide a stable reference voltage (e.g., BGREF Vx of FIG. 4 or FIG. 10) to a memory controller, e.g., the device controller 112 of FIG. 1, that can use the reference voltage to perform an action on a memory cell in a memory, e.g., the memory 116 of FIG. 1.

The reference voltage circuit can include an operation amplifier, e.g., the OPA 420 of FIG. 4 or FIG. 10, an output circuitry, e.g., the output circuitry 430 of FIG. 4 or FIG. 10, and a compensation circuitry, e.g., the compensation circuitry 450 of FIG. 4 or 1050 of FIG. 10. The process 1200 can be performed by the reference voltage circuit.

At 1202, the operational amplifier receives input voltages (e.g., $V_A$ and $V_B$ of FIG. 4 or FIG. 10) from the output circuitry and a supply voltage (e.g., Vpwr of FIG. 4 or FIG. 10).

At 1204, the operational amplifier outputs a control voltage (e.g., Vo of FIG. 4 or FIG. 10) to the output circuitry. The gate control voltage is generated by the operational amplifier based on the input voltages and the supply voltage.

At 1206, the compensational circuitry compensates the output circuitry by outputting a compensation current (e.g., $I_4$ of FIG. 4 or FIG. 10) to the output circuitry. The compensation circuitry can generate the compensation current based on one of the control voltage, a second control voltage (e.g., $V_g$ of FIG. 4 or FIG. 10) received by the operational amplifier, or a third control voltage from another circuit external to the reference voltage circuit.

At 1208, the output circuitry outputs the reference voltage based on the control voltage and the compensation current. The reference voltage can be substantially constant. For example, the reference voltage can be independent from temperature, process corner, voltage, or a combination thereof. In a particular example, the output circuitry is configured such that the reference voltage is independent from PVT effect, as illustrated in FIGS. 6A and 6B.

In some implementations, the compensation circuitry is configured to receive the control voltage and the supply voltage, generate the compensation current based on the control voltage and the supply voltage, and provide the compensation current to the output circuitry.

In some implementations, the output circuitry includes: a plurality of p-channel transistors (e.g., the transistors 432, 434, 436 of FIG. 4 or FIG. 10), having gates configured to receive the control voltage and sources configured to receive the supply voltage, and a plurality of bipolar junction transistors (BJTs) (e.g., the BJTs 439, 440, 442 of FIG. 4 or FIG. 10) having emitters respectively coupled to drains of the p-channel transistors, and bases and collectors coupled to a ground. The reference voltage is output at an output node coupled to a drain of a first p-channel transistor (e.g., the transistor 436) of the p-channel transistors and an emitter of a first BJT (e.g., the BJT 442) of the BJTs.

The compensation circuitry can include a compensation p-channel transistor (e.g., the transistor 452 of FIG. 4) corresponding to the first p-channel transistor. The compensation p-channel transistor can include: a source configured to receive the supply voltage, a gate coupled to a gate of the first p-channel transistor and configured to receive the control voltage, and a drain coupled to the emitter of the first BJT and configured to output the compensation current to the first BJT.

The output circuitry can further include a first resistor (e.g., the resistor 446 of FIG. 4 or 10) having a first end coupled to the drain of the first p-channel transistor and a second end coupled to the emitter of the first BJT. The output node can be coupled between the drain of the first p-channel transistor and the first end of the first resistor. The compensation circuitry can be coupled between the second end of the first resistor and the emitter of the first BJT and configured to provide the compensation current to the first BJT.

The output circuitry can further include a second resistor (e.g., the resistor 448 of FIG. 4 or FIG. 10) having a first end coupled to the output node and the second end coupled to the ground. The reference voltage can be associated with a ratio between the first resistor and the second resistor.

In some implementations, the output circuitry includes: a third resistor (e.g., the resistor 444 of FIG. 4 or FIG. 10) coupled between a second p-channel transistor (e.g., the transistor 434 of FIG. 4 or FIG. 10) of the p-channel transistors and a second BJT (e.g., the BJT 440 of FIG. 4 or FIG. 10) of the BJTs. A gate of a third p-channel transistor (e.g., the transistor 432 of FIG. 4 or FIG. 10) of the p-channel transistors is coupled to a gate of the second p-channel transistor, and a drain of the third p-channel transistor is coupled to an emitter of a third BJT (e.g., the BJT 438 of FIG. 4 or FIG. 10) of the BJTs.

In some implementations, the integrated circuit is configured such that the reference voltage is expressed as:

$$V_x = \frac{R_3}{R_2 + R_3}\left(V_{BE3} + \frac{R_2}{R_1}\Delta V_{BE}\right),$$

where $V_x$ represents the reference voltage, $R_2$ represents a resistance of the first resistor, $R_3$ represents a resistance of the second resistor, $R_1$ represents a resistance of the third resistor, $V_{BE3}$ represents an emitter-base voltage of the first BJT, and $\Delta V_{BE}$ represents a voltage difference of between emitter-base voltages of the second BJT and the third BJT.

The output circuitry can be configured to provide a first input voltage (e.g., $V_B$ of FIG. 4 or 10) of the input voltages at a first connection point between the drain of the second p-channel transistor and the emitter of the second BJT, and a second input voltage (e.g., $V_A$ of FIG. 4 or 10) of the input voltages at a second connection point between the drain of the third p-channel transistor to the emitter of the third BJT. In some implementations, the first connection point is between the drain of the second p-channel transistor and the third resistor.

Figure 7B:
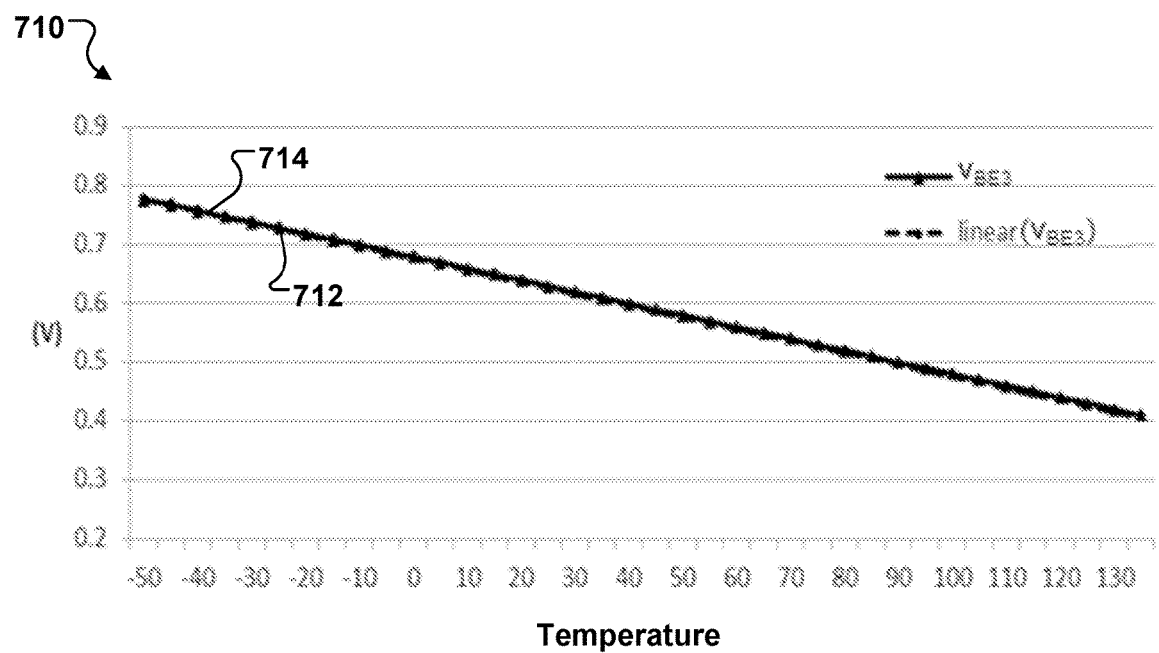
FIG. 7B shows changes of an emitter-base voltage ($V_{BE}$) of a bipolar junction transistor (BJT) in the bandgap reference circuit of FIG. 4 over a range of temperatures, according to one or more implementations of the present disclosure.
Figure 11B:
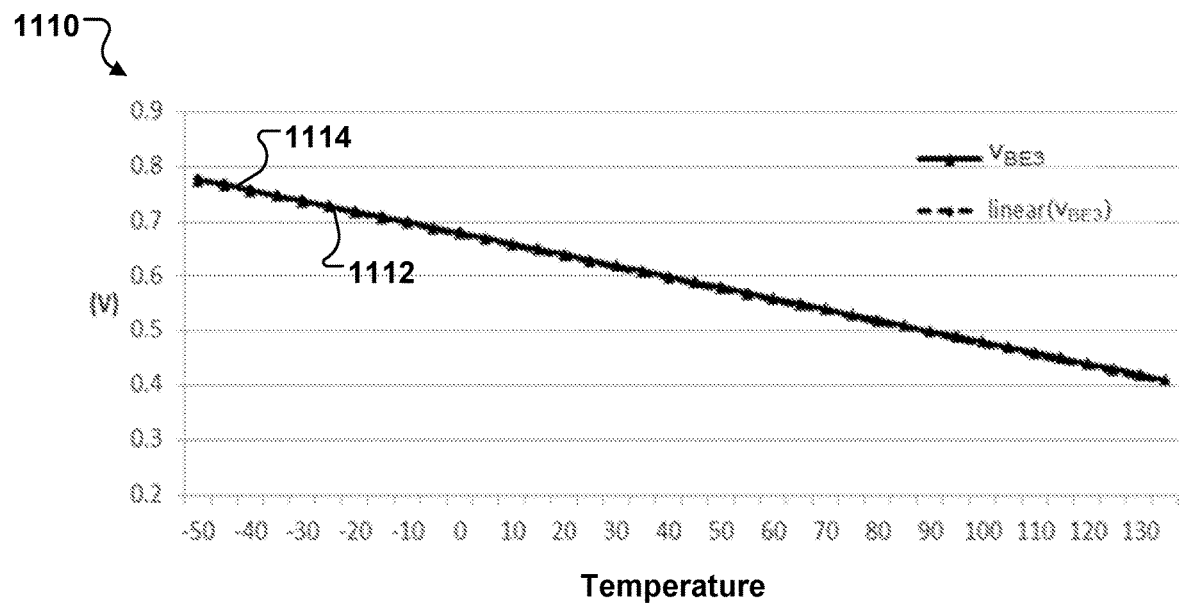
FIG. 11B shows a schematic diagram showing changes of an emitter-base voltage ($V_{BE}$) of a bipolar junction transistor (BJT) in the bandgap reference circuit of FIG. 10 over a range of temperatures, according to one or more implementations of the present disclosure.

The integrated circuit is configured such that an emitter-base voltage (e.g., $V_{BE3}$ of FIG. 4 or FIG. 10) of the first BJT is linearly inverse to a change of a temperature, as illustrated in FIG. 7B or FIG. 11B).

The integrated circuit can be configured such that a sum of $$V_{BE} \text{ and } \frac{R_1}{R_3}\Delta V_{BE}$$

can be substantially constant, and accordingly the reference voltage can be substantially constant.

In some implementations, the reference voltage circuit is configured such that the reference voltage is higher than a turn-on voltage of the first BJT, e.g., as illustrated in FIGS. 5 and 6A. The reference voltage circuit can be configured such that a current (e.g., $I_3$ of FIG. 4 or 10) from the first p-channel transistor flows through the first resistor into the first BJT and through the second resistor into the ground, as illustrated in FIG. 5.

In some implementations, the reference voltage circuit is configured such that the reference voltage is lower than a turn-on voltage of the first BJT, e.g., as illustrated in FIGS. 5 and 6B. The integrated circuit is configured such that a current from the first p-channel transistor (e.g., $I_3$ of FIG. 4 or FIG. 10) flows towards the output node into the second resistor, e.g., as illustrated in FIG. 5.

In some implementations, the compensation circuitry is configured such that the compensation current is proportional to a current flowing from the first p-channel transistor.

In some implementations, the operational amplifier (OPA) includes first and second OPA p-channel transistors (e.g., the transistors 422, 424 of FIG. 4 or FIG. 10) and first and second OPA n-channel transistors (e.g., the transistors 426, 428 of FIG. 4 or FIG. 10). Sources of the first and second OPA p-channel transistors are configured to receive the supply voltage, gates of the first and second OPA p-channel transistors are coupled together to receive the second control voltage, and drains of the first and second OPA p-channel transistors are respectively coupled to drains of the first and second OPA n-channel transistors. Gates of the first and second OPA n-channel transistors are respectively configured to receive the input voltages from the output circuitry. The operational amplifier can be configured to output the control voltage at a first OPA connection point between a drain of the first OPA p-channel transistor and a drain of the first OPA n-channel transistor.

The compensation circuitry can be coupled to the operational amplifier and configured to receive the second control voltage, generate the compensation current based on the second control voltage, and provide the compensation current to the output circuitry.

In some implementations, the reference voltage circuit further includes: a first startup circuit coupled to the first OPA connection point and configured to receive a startup signal (e.g., the POR signal of FIG. 4 or FIG. 10) to startup the integrated circuit, and a second startup circuit coupled to a second OPA connection point between a drain of the second OPA p-channel transistor and a drain of the second OPA n-channel transistor and configured to provide the second gate control voltage to the first and second OPA p-channel transistors, the second startup circuit corresponding to the first startup circuit.

In some examples, the first startup circuit includes a first startup transistor (e.g., the transistor 404 of FIG. 4 or FIG. 10) having a source coupled to the ground, a gate configured to receive the startup signal, and a drain coupled to the first OPA connection point. The second startup circuit includes a second startup transistor (e.g., the transistor 406 of FIG. 4 or FIG. 10) having a source coupled to the ground, a gate configured to receive a voltage signal, and a drain coupled to the second OPA connection point, the second startup transistor corresponding to the first startup transistor.

In some implementations, the compensation circuitry includes a compensation p-channel transistor (e.g., the transistor 1052 of FIG. 10) corresponding to the first OPA p-channel transistor and the second OPA p-channel transistor. The compensation p-channel transistor can include: a source configured to receive the supply voltage, a gate coupled to a gate of the first OPA p-channel transistor and configured to receive the second control voltage, and a drain coupled to an emitter of a corresponding BJT (e.g., the BJT 442 of FIG. 4 or FIG. 10) in the output circuitry and configured to output the compensation current to the corresponding BJT.

In some implementations, the integrated circuit further includes: a power supply switch configured to receive an original supply voltage (e.g., VDD of FIG. 4 or FIG. 10) and provide a controlled supply voltage (e.g., Vpwr of FIG. 4 or FIG. 10) controllable by an enabling signal (e.g., ENB signal of FIG. 4 or FIG. 10) as the supply voltage to the operational amplifier, the output circuitry, and the compensation circuitry. The power supply switch can include a power transistor (e.g., the transistor 410 of FIG. 4 or FIG. 10) having a gate for receiving the enabling signal and configured to generate the controlled supply voltage based on the original supply voltage in response to the enabling signal.

In some implementations, the integrated circuit includes a coupling capacitor (e.g., the capacitor 402 of FIG. 4 or 10) having a first end for receiving the supply voltage and a second end coupled to an output of the operational amplifier for outputting the control voltage.

In some implementations, the compensation circuitry is coupled to a second circuit external to the reference voltage circuit in the memory system and configured to generate a compensation current corresponding to a current in the second circuit, and the compensation circuitry is configured to receive the third control voltage from the second circuit, generate the compensation current based on the third control voltage, and provide the compensation current to the output circuitry.

The disclosed and other examples can be implemented as one or more computer program products, for example, one or more modules of computer program instructions encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. An integrated circuit comprising:
   an operational amplifier (OPA);
   an output circuitry; and
   a compensation circuitry,
   wherein the operational amplifier is configured to receive input voltages from the output circuitry and a supply voltage and output a gate control voltage based on the input voltages and the supply voltage,
   wherein the output circuitry is configured to receive the gate control voltage from the operational amplifier and the supply voltage, provide the input voltages to the operational amplifier, and output a reference voltage, and
   wherein the compensation circuitry is coupled to the output circuitry and configured to output a compensation current to the output circuitry to compensate the output circuitry such that the reference voltage is substantially constant,
   wherein the output circuitry is configured to generate the reference voltage based on the gate control voltage and the compensation current,
   wherein the operational amplifier comprises at least two transistors, and gates of the at least two transistors are coupled together to receive a second gate control voltage, and wherein the compensation circuitry is coupled to the operational amplifier and configured to receive the second gate control voltage, generate the compensation current based on the second gate control voltage, and provide the compensation current to the output circuitry, and
   wherein the compensation circuitry comprises one or more transistors corresponding to one or more transistors in the operational amplifier, such that the compensation current flowing from the one or more transistors in the compensation circuitry is proportional to and smaller than a corresponding current flowing from the one or more transistors in the operational amplifier.

2. The integrated circuit of claim 1, wherein the output circuitry comprises:
   a plurality of p-channel transistors having gates configured to receive the gate control voltage and sources configured to receive the supply voltage; and
   a plurality of bipolar junction transistors (BJTs) having emitters respectively coupled to drains of the p-channel transistors, and bases and collectors coupled to a ground,
   wherein the reference voltage is output at an output node coupled to a drain of a first p-channel transistor of the p-channel transistors and an emitter of a first BJT of the BJTs.

3. The integrated circuit of claim 2, wherein the compensation circuitry comprises a compensation p-channel transistor, and
   wherein the compensation p-channel transistor comprises:
      a source configured to receive the supply voltage,
      a gate configured to receive the second gate control voltage, and
      a drain coupled to the emitter of the first BJT and configured to output the compensation current to the first BJT.

4. The integrated circuit of claim 2, wherein the output circuitry comprises:
   a first resistor having a first end coupled to the drain of the first p-channel transistor and a second end coupled to the emitter of the first BJT,
   wherein the output node is coupled between the drain of the first p-channel transistor and the first end of the first resistor, and
   wherein the compensation circuitry is coupled to a connection point between the second end of the first resistor and the emitter of the first BJT and configured to provide the compensation current to the first BJT.

5. The integrated circuit of claim 4, wherein the output circuitry comprises:
a second resistor having a first end coupled to the output node and a second end coupled to the ground, and
wherein the reference voltage is associated with a ratio between the first resistor and the second resistor.

6. The integrated circuit of claim 5, wherein the output circuitry comprises:
a third resistor coupled between a second p-channel transistor of the p-channel transistors and a second BJT of the BJTs,
wherein a gate of a third p-channel transistor of the p-channel transistors is coupled to a gate of the second p-channel transistor, and a drain of the third p-channel transistor is coupled to an emitter of a third BJT of the BJTs, and
wherein the integrated circuit is configured such that the reference voltage is expressed as:

$$V_x = \frac{R_2}{R_1 + R_2}\left(V_{BE} + \frac{R_1}{R_3}\Delta V_{BE}\right),$$

where $V_x$ represents the reference voltage, $R_1$ represents a resistance of the first resistor, $R_2$ represents a resistance of the second resistor, $R_3$ represents a resistance of the third resistor, $V_{BE}$ represents an emitter-base voltage of the first BJT, and $\Delta V_{BE}$ represents a voltage difference between emitter-base voltages of the second BJT and the third BJT.

7. The integrated circuit of claim 6, wherein the integrated circuit is configured such that a sum of $$V_{BE} \text{ and } \frac{R_1}{R_3}\Delta V_{BE}$$

is substantially constant.

8. The integrated circuit of claim 6, wherein the output circuitry is configured to provide
a first input voltage of the input voltages at a first connection point between a drain of the second p-channel transistor and an emitter of the second BJT, and
a second input voltage of the input voltages at a second connection point between the drain of the third p-channel transistor to the emitter of the third BJT.

9. The integrated circuit of claim 5, wherein the integrated circuit is configured such that the reference voltage is higher than a turn-on voltage of the first BJT, and
wherein the integrated circuit is configured such that a current from the first p-channel transistor flows through the first resistor into the first BJT and through the second resistor into the ground.

10. The integrated circuit of claim 5, wherein the integrated circuit is configured such that the reference voltage is lower than a turn-on voltage of the first BJT, and
wherein the integrated circuit is configured such that a current from the first p-channel transistor flows towards the output node into the second resistor.

11. The integrated circuit of claim 2, wherein the integrated circuit is configured such that an emitter-base voltage of the first BJT is linearly inverse to a change of a temperature.

12. The integrated circuit of claim 1, wherein the operational amplifier comprises first and second OPA p-channel transistors and first and second OPA n-channel transistors,
wherein sources of the first and second OPA p-channel transistors are configured to receive the supply voltage, gates of the first and second OPA p-channel transistors are coupled together to receive the second gate control voltage, and drains of the first and second OPA p-channel transistors are respectively coupled to drains of the first and second OPA n-channel transistors,
wherein gates of the first and second OPA n-channel transistors are respectively configured to receive the input voltages from the output circuitry, and
wherein the operational amplifier is configured to output the gate control voltage at a first OPA connection point between a drain of the first OPA p-channel transistor and a drain of the first OPA n-channel transistor.

13. The integrated circuit of claim 12, further comprising:
a first startup circuit coupled to the first OPA connection point and configured to receive a startup signal to startup the integrated circuit; and
a second startup circuit coupled to a second OPA connection point between a drain of the second OPA p-channel transistor and a drain of the second OPA n-channel transistor and configured to provide the second gate control voltage to the first OPA p-channel transistor and the second OPA p-channel transistor, the second startup circuit corresponding to the first startup circuit.

14. The integrated circuit of claim 13, wherein the first startup circuit comprises a first startup transistor having a source coupled to a ground, a gate configured to receive the startup signal, and a drain coupled to the first OPA connection point, and
wherein the second startup circuit comprises a second startup transistor having a source coupled to the ground, a gate configured to receive a voltage signal, and a drain coupled to the second OPA connection point, the second startup transistor corresponding to the first startup transistor.

15. The integrated circuit of claim 13, wherein the compensation circuitry comprises a compensation p-channel transistor corresponding to the first OPA p-channel transistor and the second OPA p-channel transistor, and
wherein the compensation p-channel transistor comprises:
a source configured to receive the supply voltage,
a gate coupled to a gate of the first OPA p-channel transistor and configured to receive the second gate control voltage, and
a drain coupled to an emitter of a corresponding BJT in the output circuitry and configured to output the compensation current to the corresponding BJT.

16. The integrated circuit of claim 1, further comprising:
a power supply switch configured to receive an original supply voltage and provide a controlled supply voltage controllable by an enabling signal as the supply voltage to the operational amplifier, the output circuitry, and the compensation circuitry,
wherein the power supply switch comprises a power transistor having a gate for receiving the enabling signal and being configured to generate the controlled supply voltage based on the original supply voltage in response to the enabling signal.

17. The integrated circuit of claim 1, further comprising:
a coupling capacitor having a first end for receiving the supply voltage and a second end coupled to an output of the operational amplifier for outputting the gate control voltage.

18. The integrated circuit of claim 1, wherein the integrated circuit is configured to stabilize the reference voltage to be independent from temperature, process corner, voltage, or a combination thereof.

19. A memory system comprising:
a memory;
a memory controller coupled to the memory; and
a bandgap reference circuit coupled to the memory controller and configured to provide a bandgap reference voltage to the memory controller for performing one or more actions on the memory, the bandgap reference circuit comprising:
an operational amplifier;
an output circuitry; and
a compensation circuitry,
wherein the operational amplifier is configured to receive input voltages from the output circuitry and a supply voltage and output a gate control voltage based on the input voltages and the supply voltage,
wherein the output circuitry is configured to receive the gate control voltage from the operational amplifier and the supply voltage, provide the input voltages to the operational amplifier, and output the bandgap reference voltage, and
wherein the compensation circuitry is coupled to the output circuitry and configured to output a compensation current to the output circuitry to compensate the output circuitry such that the bandgap reference voltage is substantially constant,
wherein the output circuitry is configured to generate the bandgap reference voltage based on the gate control voltage and the compensation current,
wherein the operational amplifier comprises at least two transistors, and gates of the at least two transistors are coupled together to receive a second gate control voltage, and wherein the compensation circuitry is coupled to the operational amplifier and configured to receive the second gate control voltage, generate the compensation current based on the second gate control voltage, and provide the compensation current to the output circuitry, and
wherein the compensation circuitry comprises one or more transistors corresponding to one or more transistors in the operational amplifier, such that the compensation current flowing from the one or more transistors in the compensation circuitry is proportional to and smaller than a corresponding current flowing from the one or more transistors in the operational amplifier.

20. A method of managing reference voltages, the method comprising:
receiving, by an operational amplifier, input voltages from an output circuitry and a supply voltage;
outputting, by the operational amplifier and based on the input voltages and the supply voltage, a first control voltage to the output circuitry;
compensating, by a compensation circuitry, the output circuitry by outputting a compensation current to the output circuitry, the compensation current being based on a second control voltage received by the compensation circuitry, wherein the operational amplifier comprises at least two transistors, and gates of the at least two transistors are coupled together to receive the second control voltage, and wherein the compensation circuitry is coupled to the operational amplifier to receive the second control voltage and to generate the compensation current based on the second control voltage; and
outputting, by the output circuitry and based on the first control voltage and the compensation current, a reference voltage that is substantially constant,
wherein the compensation circuitry comprises one or more transistors corresponding to one or more transistors in the operational amplifier, and the compensation current flowing from the one or more transistors in the compensation circuitry is proportional to and smaller than a corresponding current flowing from the one or more transistors in the operational amplifier.

* * * * *